US012402290B2

(12) United States Patent
Oh

(10) Patent No.: US 12,402,290 B2
(45) Date of Patent: Aug. 26, 2025

(54) DISPLAY DEVICE AND METHOD OF MANUFACTURING THE SAME

(71) Applicant: SAMSUNG DISPLAY CO., LTD., Yongin-si (KR)

(72) Inventor: Myong-Soo Oh, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 187 days.

(21) Appl. No.: 18/050,421

(22) Filed: Oct. 27, 2022

(65) Prior Publication Data

US 2023/0301048 A1 Sep. 21, 2023

(30) Foreign Application Priority Data

Mar. 16, 2022 (KR) .................. 10-2022-0032758

(51) Int. Cl.
*H05K 13/00* (2006.01)
*H05K 1/11* (2006.01)
*H05K 3/32* (2006.01)

(52) U.S. Cl.
CPC ......... *H05K 13/0015* (2013.01); *H05K 1/117* (2013.01); *H05K 3/325* (2013.01); *H05K 2201/0338* (2013.01); *H05K 2201/10128* (2013.01); *H05K 2203/166* (2013.01)

(58) Field of Classification Search
CPC ...... H05K 1/117; H05K 1/11; H05K 13/0015; H05K 1/118
See application file for complete search history.

(56) References Cited

U.S. PATENT DOCUMENTS

| 8,324,744 | B2 | 12/2012 | Kim et al. | |
|---|---|---|---|---|
| 9,831,432 | B2 | 11/2017 | Im | |
| 2013/0207933 | A1* | 8/2013 | Mamba | G02F 1/13452 345/174 |
| 2017/0148374 | A1* | 5/2017 | Lee | G02F 1/13336 |
| 2019/0067406 | A1* | 2/2019 | Lee | H10K 59/131 |
| 2019/0229174 | A1* | 7/2019 | Choi | H10K 59/1315 |
| 2020/0243039 | A1* | 7/2020 | Han | G09G 5/006 |
| 2021/0265455 | A1 | 8/2021 | Lee et al. | |
| 2021/0351262 | A1 | 11/2021 | Kim et al. | |
| 2022/0013620 | A1 | 1/2022 | Kim et al. | |

FOREIGN PATENT DOCUMENTS

| KR | 1020070117110 | 12/2007 |
|---|---|---|
| KR | 10-0881183 | 1/2009 |
| KR | 1020170039813 | 4/2017 |
| KR | 1020190021525 | 3/2019 |
| KR | 10-1979749 | 5/2019 |
| KR | 1020200018749 | 2/2020 |
| KR | 1020210080891 | 7/2021 |
| KR | 1020220006688 | 1/2022 |

* cited by examiner

*Primary Examiner* — Jerry Wu
(74) *Attorney, Agent, or Firm* — F. CHAU & ASSOCIATES, LLC

(57) ABSTRACT

A display device includes a film align pad disposed under a connection film connected to a display panel and including a base lead and an align lead. The base lead extends in a first direction and the align lead protrudes from the base lead in a second direction intersecting the first direction. A board align pad is disposed on a printed circuit board, is connected to the connection film, and includes a base land and an align land. The base land extends in the first direction and the align land protrudes from the base land in the second direction.

14 Claims, 20 Drawing Sheets

DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2022-0032758, filed on Mar. 16, 2022, the content of which in its entirety is herein incorporated by reference.

TECHNICAL FIELD

The present disclosure relates to a display device and, more specifically, to a display device and a method of manufacturing the display device.

DISCUSSION OF THE RELATED ART

A display device generally includes a display panel, a connection film, and a printed circuit board. The printed circuit board generates a signal and/or voltage for driving the display panel, and the connection film is used to transmit the signal and/or the voltage from the printed circuit board to the display panel. In particular, the connection film includes a set of film pads and the printed circuit board includes a set of board pads. The display panel is directly connected to the connection film and the film pads make contact with the board pads to complete the connection between the display panel and the printed circuit board.

To increase the quality of the display device (e.g., increase the display resolution, increase display frequency, etc.), research to reduce the spacing between the film pads and the board pads has been recently conducted.

SUMMARY

A display device includes a film align pad disposed under a connection film that is connected to a display panel. The display device further including a base lead and an align lead. The base lead extends in a first direction and the align lead protrudes from the base lead in a second direction intersecting the first direction. A board align pad is disposed on a printed circuit board connected to the connection film and the board align pad includes a base land and an align land. The base land extends in the first direction and the align land protrudes from the base land in the second direction.

The align lead may completely overlap the align land and the align land may partially overlaps the align lead.

A length of the align lead in the first direction may be smaller than a length of the align land in the first direction.

A length of the align lead in the second direction may be equal to a length of the align land in the second direction.

The align lead and the align land might not overlap each other.

A length of the align lead in the second direction may be equal to a length of the align land in the second direction.

The align lead may partially overlap the align land and the align land may partially overlap the align lead.

A length of the align lead in the first direction may be greater than a length of the align land in the first direction.

A length of the align lead in the second direction may be smaller than a length of the align land in the second direction.

The display device may further include film pads disposed under the connection film and arranged in the second direction. The film align pad may be arranged in the second direction together with the film pads.

The display device may further include board pads disposed on the printed circuit board and arranged in the second direction. The board align pad may be arranged in the second direction together with the board pads.

A method of manufacturing a display device includes aligning an align lead disposed under a connection film and an align land disposed on a printed circuit board. A first distance in a first direction between a first end of the align lead and a first end of the align land is measured. A second distance in the first direction between a second end of the align lead and a second end of the align land is measured. The connection film and the printed circuit board are realigned in the first direction so that a measured value between the first distance and the second distance is equal to a target value.

The target value may be set according to a degree of curvature of the connection film.

The connection film may be provided in a reel.

A degree of curvature of the connection film positioned at an outer diameter of the reel may be different from a degree of curvature of the connection film positioned at an inner diameter of the reel.

While the connection film and the printed circuit board are realigned in the first direction, the printed circuit board may be fixed in the first direction and the connection film may move in the first direction.

The measured value may be a difference between the first distance and the second distance.

the align lead may be disposed under the connection film and may protrude from a base lead in a second direction intersecting the first direction, and the base lead may extend in the first direction.

The align land may be disposed on the printed circuit board and may protrude from a base land in the second direction, and the base land may extend in the first direction.

The method may further include compression bonding the connection film and the printed circuit board, after the realigning the connection film and the printed circuit board in the first direction.

BRIEF DESCRIPTION OF THE DRAWINGS

The accompanying drawings, which are included to provide a further understanding of the inventive concept and are incorporated in and constitute a part of this specification, illustrate embodiments of the inventive concept together with the description.

DETAILED DESCRIPTION

Embodiments of the present disclosure will be more clearly understood from the following detailed description in conjunction with the accompanying drawings.

Figure 1:
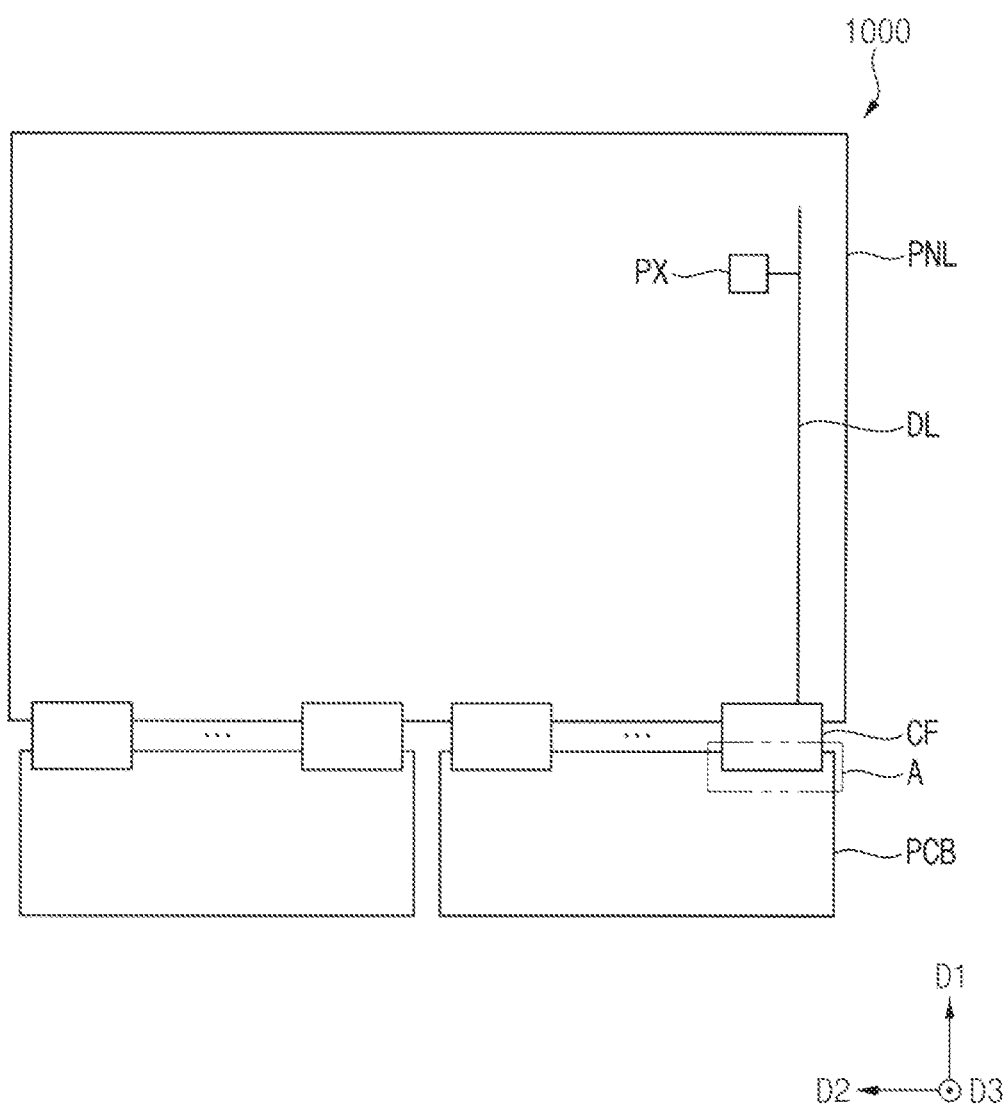
FIG. 1 is a plan view illustrating a display device according to an embodiment of the present invention.

FIG. 1 is a plan view illustrating a display device according to an embodiment of the present invention.

Referring to FIG. 1, a display device 1000, according to an embodiment of the present disclosure, may include a display panel PNL, at least one connection film CF, and at least one printed circuit board PCB.

The display panel PNL may be connected to the connection film CF. At least one pixel PX may be disposed on the display panel PNL. The pixel PX may generate a driving current by using a signal and/or a voltage applied through the connection film CF. In addition, the pixel PX may emit light corresponding to the driving current. As light is emitted from the pixel PX, the display panel PNL may display an image.

In addition, a data line DL extending in a first direction D1 may be disposed on the display panel PNL. The data line DL may be connected to the connection film CF and the pixel PX, and may provide a data voltage to the pixel PX.

The connection film CF may be connected to the display panel PNL and the printed circuit board PCB. The connection film CF may electrically connect the display panel PNL and the printed circuit board PCB. For example, film pads (e.g., a film pads FP of FIG. 2) and a film align pad (e.g., a first film align pad FAP1 of FIG. 2) may be disposed under the connection film CF. The film pads and the film align pad may connect the connection film CF to the printed circuit board PCB.

In an embodiment, the connection film CF may be disposed on one side of the display panel PNL, and may be arranged side by side in a second direction D2 intersecting the first direction D1.

The printed circuit board PCB may be connected to the connection film CF. The printed circuit board PCB may be electrically connected to the display panel PNL through the connection film CF. For example, board pads (e.g., board pads BP of FIG. 2) and a board align pad (e.g., a first board align pad BAP1 of FIG. 2) may be disposed on the printed circuit board PCB. The board pads and the board align pad may connect the printed circuit board PCB to the connection film CF.

In an embodiment, the printed circuit board PCB may be disposed on one side of the connection film CF, and may be arranged side by side in the second direction D2.

Figure 2:
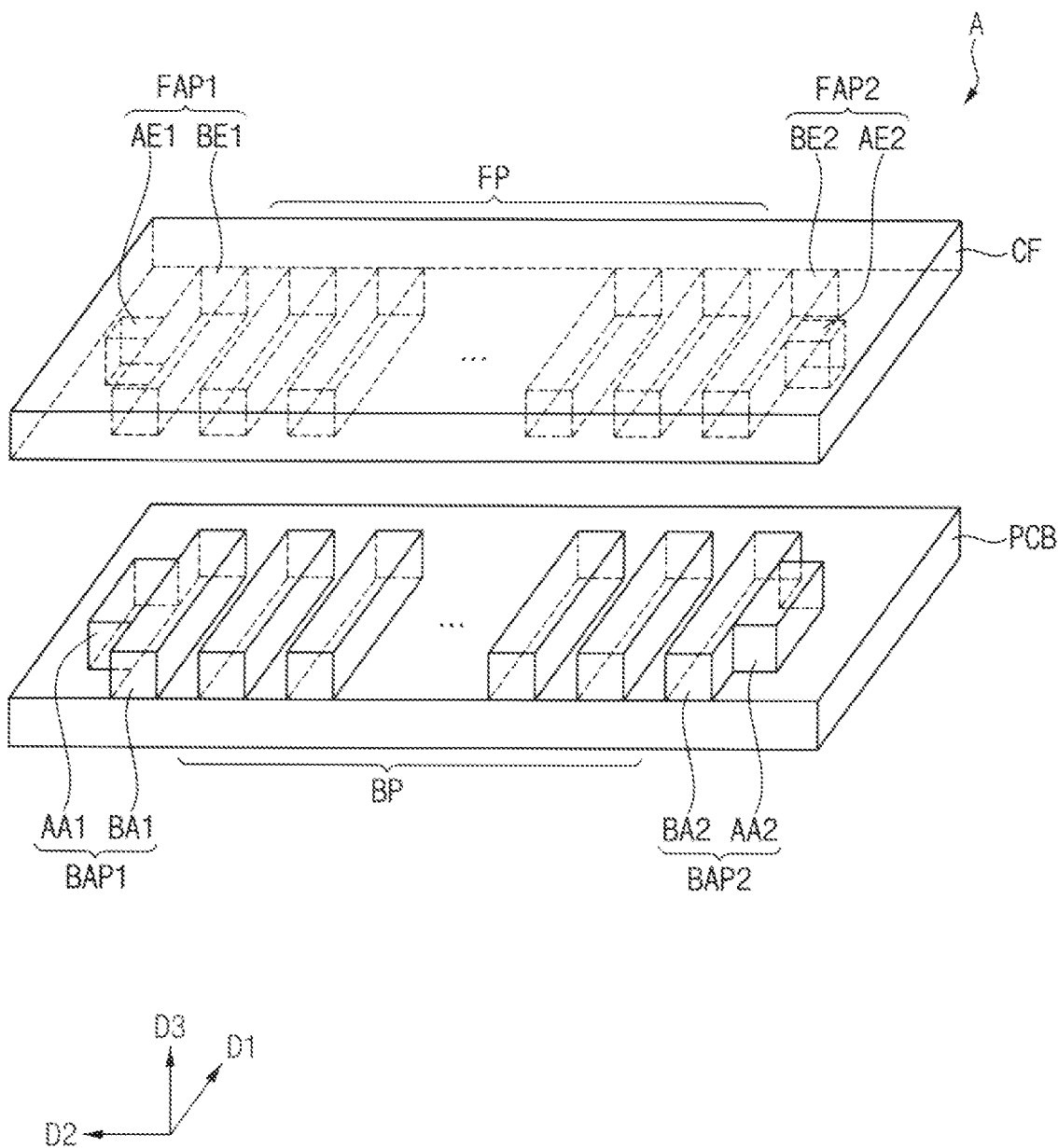
FIG. 2 is an enlarged exploded perspective view of area A of FIG. 1.
Figure 3:
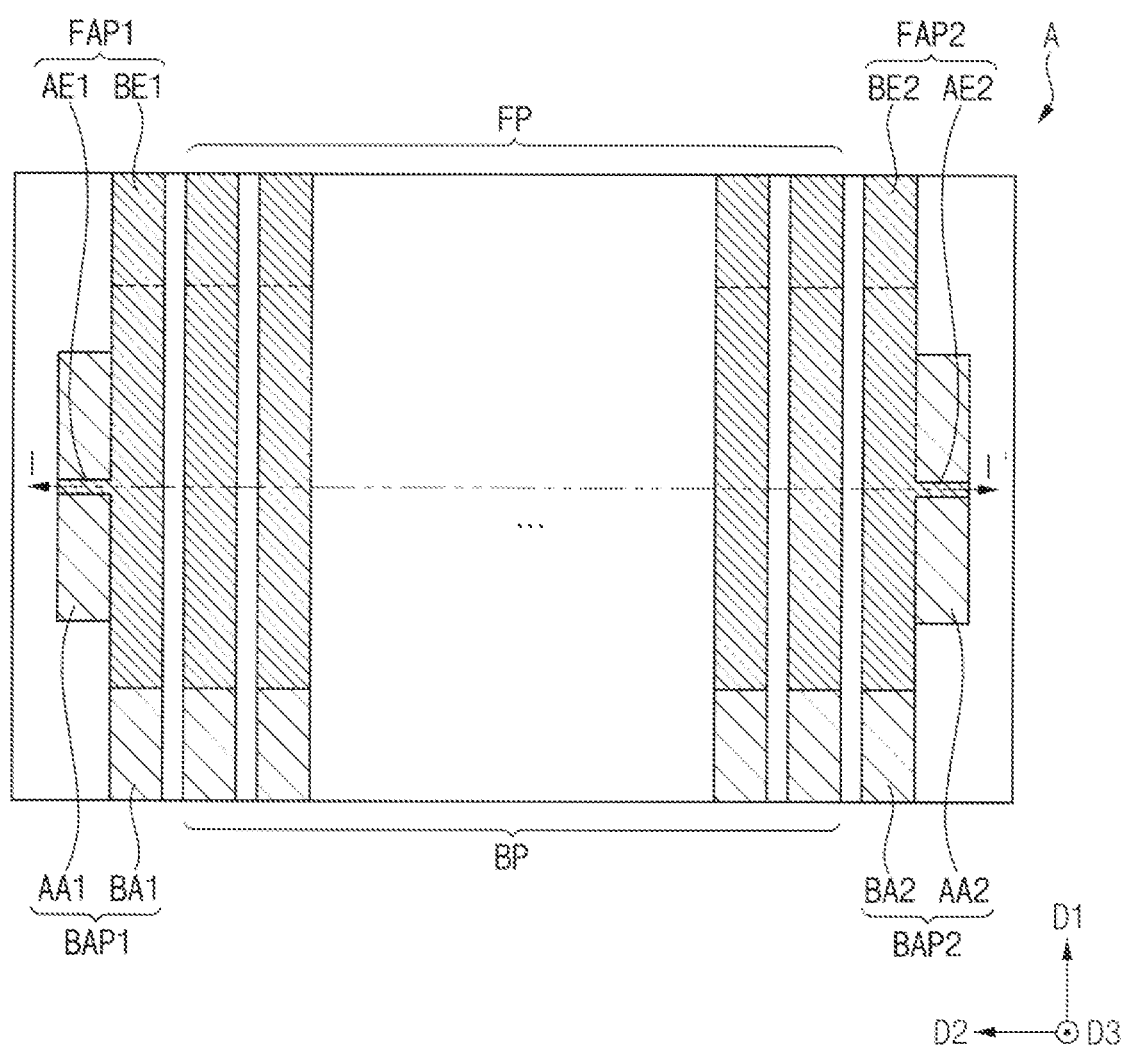
FIG. 3 is an enlarged plan view of area A of FIG. 1.
Figure 4:
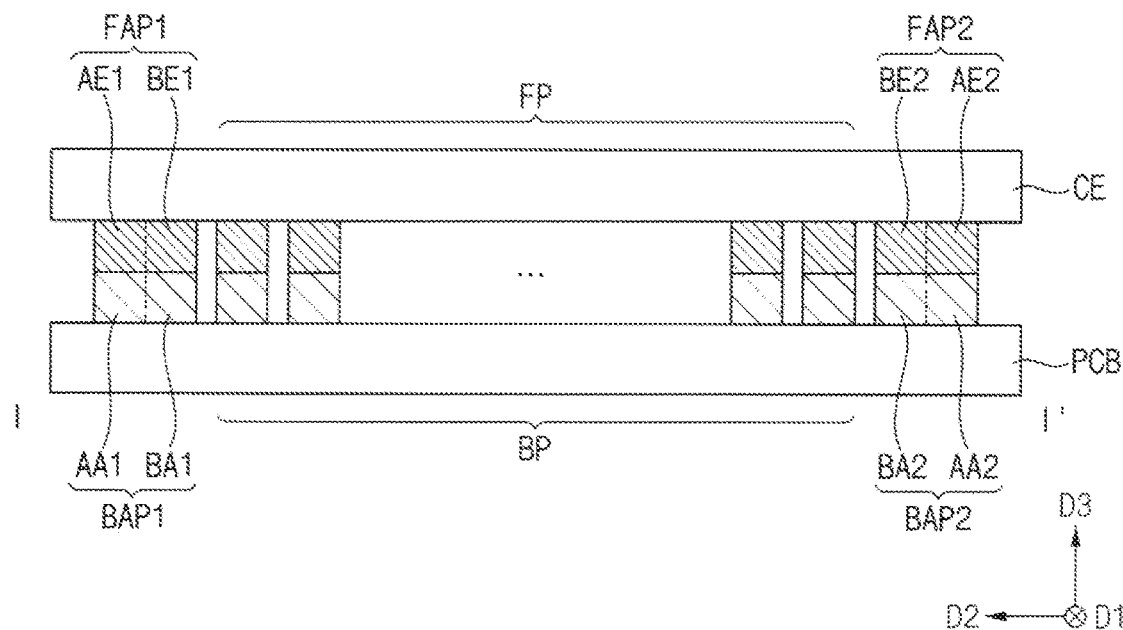
FIG. 4 is a cross-sectional view taken along line I-I' of FIG. 3.

FIG. 2 is an enlarged exploded perspective view of area A of FIG. 1. FIG. 3 is an enlarged plan view of area A of FIG. 1. FIG. 4 is a cross-sectional view taken along line I-I' of FIG. 3.

Referring to FIG. 2, a first film align pad FAP1, film pads FP, and a second film align pad FAP2 may be disposed under the connection film CF. A first board align pad BAP1, board pads BP, and a second board align pad BAP2 may be disposed on the printed circuit board PCB.

The second film align pad FAP2, the film pads FP, and the first film align pad FAP1 may be arranged side by side in the second direction D2. The film pads FP may be disposed between the first film align pad FAP1 and the second film align pad FAP2.

The first film align pad FAP1 may include a first base lead BE1 and a first align lead AE1. The first base lead BE1 may extend in the first direction D1. The first align lead AE1 may protrude from the first base lead BE1 in the second direction D2.

The film pads FP may be arranged side by side in the second direction D2. Each of the film pads FP may extend in the first direction D1. For example, the shape of each of the film pads FP may be substantially the same as the shape of the first base lead BE1.

The second film align pad FAP2 may include a second base lead BE2 and a second align lead AE2. The second base lead BE2 may extend in the first direction D1. The second align lead AE2 may protrude from the second base lead BE2 in a direction opposite to the second direction D2.

The board align pad BAP2, the board pads BP, and the first board align pad BAP1 may be arranged side by side in the second direction D2. The board pads BP may be disposed between the first board align pad BAP1 and the second board align pad BAP2.

The first board align pad BAP1 may include a first base land BA1 and a first align land AA1. The first base land BA1 may extend in the first direction D1. The first align land AA1 may protrude from the first base land BA1 in the second direction D2.

The board pads BP may be arranged side by side in the second direction D2. Each of the board pads BP may extend in the first direction D1. For example, the shape of each of the board pads BP may be substantially the same as the shape of the first base land BA1.

The second board align pad BAP2 may include a second base land BA2 and a second align land AA2. The second base land BA2 may extend in the first direction D1. The second align land AA2 may protrude from the second base land BA2 in a direction opposite to the second direction D2.

Referring to FIG. 3, the first base lead BE1 may at least partially overlap the first base land BA1. The first align lead AE1 may at least partially overlap the first align land AA1. The film pads FP may at least partially overlap the board pads BP, respectively. The second base lead BE2 may at least partially overlap the second base land BA2. The second align lead AE2 may at least partially overlap the second align land AA2.

In an embodiment, the first align lead AE1 may completely overlap the first align land AA1. In addition, the first align land AA1 may partially overlap the first align lead AE1.

For example, a length of the first align lead AE1 in the first direction D1 may be smaller than a length of the first align land AA1 in the first direction D1. In addition, a length of the first align lead AE1 in the second direction D2 may be substantially the same as a length of the first align land AA1 in the second direction D2.

In an embodiment, the second align lead AE2 may completely overlap the second align land AA2. In addition, the second align land AA2 may partially overlap the second align lead AE2.

For example, a length of the second align lead AE2 in the first direction D1 may be smaller than a length of the second align land AA2 in the first direction D1. In addition, a length of the second align lead AE2 in the second direction D2 may be substantially the same as a length of the second align land AA2 in the second direction D2.

Referring to FIG. 4, the first base lead BE1 may contact the first base land BA1. The first align lead AE1 may contact the first align land AA1. The film pads FP may contact the board pads BP, respectively. The second base lead BE2 may contact the second base land BA2. The second align lead AE2 may contact the second align land AA2.

Figure 5:
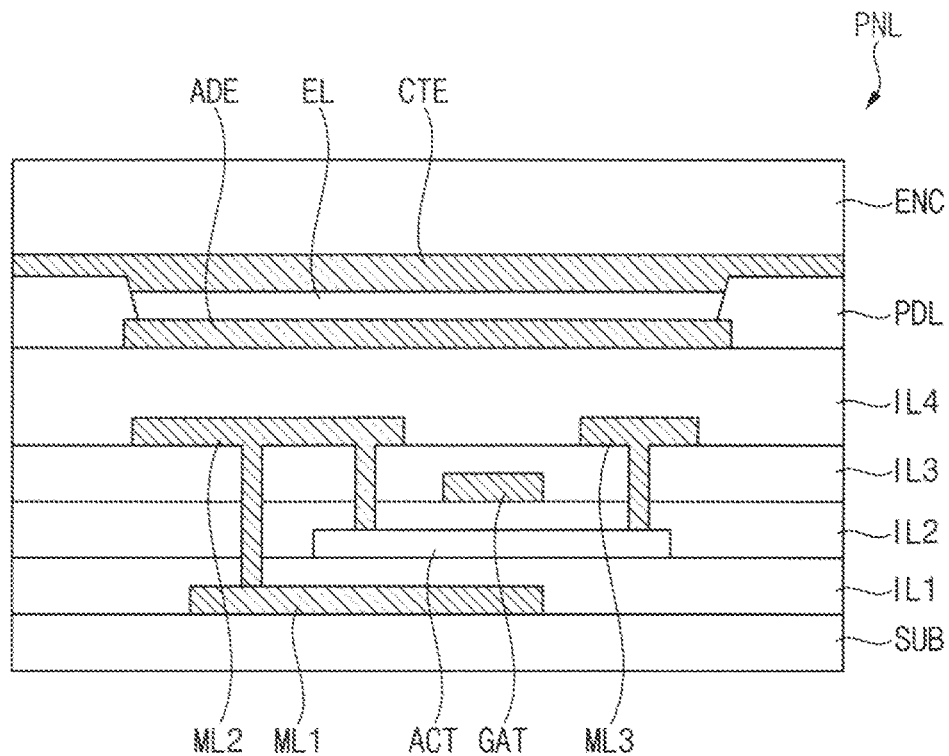
FIG. 5 is a cross-sectional view illustrating a display panel included in the display device of FIG. 1.

FIG. 5 is a cross-sectional view illustrating a display panel included in the display device of FIG. 1.

Referring to FIG. 5, the display panel PNL may include a substrate SUB, a lower conductive pattern ML1, a first insulating layer ILL an active pattern ACT, a second insulating layer IL2, a gate electrode GAT, a third insulating layer IL3, a first upper conductive pattern ML2, a second upper conductive pattern ML3, a fourth insulating layer IL4, a first electrode ADE, a pixel defining layer PDL, an emission layer EL, a second electrode CTE, and an encapsulation layer ENC.

The substrate SUB may include a transparent or opaque material. Examples of the material that can be used as the substrate SUB may include glass, quartz, plastic, or the like. These may be used alone or in combination with each other.

The lower conductive pattern ML1 may be disposed on the substrate SUB. In an embodiment, the lower conductive pattern ML1 may be formed of a metal, an alloy, a conductive metal oxide, a transparent conductive material, or the like. Examples of materials that can be used as the lower conductive pattern ML1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other. In addition, the lower conductive pattern ML1 may be formed of a single layer or may be formed of multiple layers.

The first insulating layer IL1 may be disposed on the lower conductive pattern ML1. In an embodiment, the first insulating layer IL1 may be formed of an insulating material. Examples of the insulating material that can be used as the first insulating layer IL1 may include silicon oxide, silicon nitride, silicon oxynitride, and the like. These may be used alone or in combination with each other. In addition, the first insulating layer IL1 may be formed of a single layer or may be formed of multiple layers.

The active pattern ACT may be disposed on the first insulating layer IL1. In an embodiment, the active pattern ACT may be formed of a silicon semiconductor material or an oxide semiconductor material. Examples of the silicon semiconductor material that may be used as the active pattern ACT may include amorphous silicon, polycrystalline silicon, or the like. Examples of the oxide semiconductor material that may be used as the active pattern ACT may include IGZO (InGaZnO) and ITZO (InSnZnO). In addition, the oxide semiconductor material may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). These may be used alone or in combination with each other.

The second insulating layer IL2 may be disposed on the active pattern ACT. In an embodiment, the second insulating layer IL2 may be formed of an insulating material. Examples of the insulating material that can be used as the second insulating layer IL2 may include silicon oxide, silicon nitride, silicon oxynitride, and the like. These may be used alone or in combination with each other. In addition, the second insulating layer IL2 may be formed of a single layer or may be formed of multiple layers.

The gate electrode GAT may be disposed on the second insulating layer IL2. In an embodiment, the gate electrode GAT may be formed of a metal, an alloy, a conductive metal oxide, a transparent conductive material, or the like. Examples of the material that can be used as the gate electrode GAT may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other. In addition, the gate electrode GAT may be formed of a single layer or may be formed of multiple layers.

The third insulating layer IL3 may be disposed on the gate electrode GAT. In an embodiment, the third insulating layer IL3 may be formed of an insulating material. Examples of the insulating material that can be used as the third insulating layer IL3 may include silicon oxide, silicon nitride, silicon oxynitride, and the like. These may be used alone or in combination with each other. In addition, the third insulating layer IL3 may be formed of a single layer or may be formed of multiple layers.

The first upper conductive pattern ML2 and the second upper conductive pattern ML3 may be disposed on the third insulating layer IL3. The first upper conductive pattern ML2 and the second upper conductive pattern ML3 may be formed together and may include the same material.

In an embodiment, the first upper conductive pattern ML2 and the second upper conductive pattern ML3 may be formed of a metal, an alloy, a conductive metal oxide, a transparent conductive material, or the like. Examples of materials that may be used as the first upper conductive pattern ML2 and the second upper conductive pattern ML3 may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other. In addition, the first upper conductive pattern ML2 and the second upper conductive pattern ML3 may be formed of a single layer or may be formed of multiple layers.

The first upper conductive pattern ML2 may contact the first lower conductive pattern ML1 and the active pattern ACT. The second upper conductive pattern ML3 may contact the active pattern ACT.

The fourth insulating layer IL4 may be disposed on the first and second upper conductive patterns ML2 and ML3. In an embodiment, the fourth insulating layer IL4 may be formed of an organic insulating material and/or an inorganic insulating material. Examples of the organic insulating material that can be used as the fourth insulating layer IL4 include photoresist, polyacrylic resin, polyimide resin, acrylic resin, and the like. Examples of the inorganic insulating material that can be used as the fourth insulating layer IL4 may include silicon oxide, silicon nitride, silicon oxynitride, and the like. These may be used alone or in combination with each other. In addition, the fourth insulating layer IL4 may be formed of a single layer or may be formed of multiple layers.

The first electrode ADE may be disposed on the fourth insulating layer IL4. In an embodiment, the first electrode ADE may be formed of a metal, an alloy, a conductive metal oxide, a transparent conductive material, or the like. Examples of materials that can be used as the first electrode ADE may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other. In addition, the first electrode ADE may be formed of a single layer or may be formed of multiple layers.

The pixel defining layer PDL may be disposed on the fourth insulating layer IL4. An opening exposing the first electrode ADE may be formed in the pixel defining layer PDL.

The emission layer EL may be disposed in the opening on the first electrode ADE. The emission layer EL may emit light in response to the driving current.

The second electrode CTE may be disposed on the emission layer EL.

The encapsulation layer ENC may be disposed on the second electrode CTE. The encapsulation layer ENC may include at least one inorganic layer and at least one organic layer, and may prevent penetration of air and/or moisture.

Figure 6:
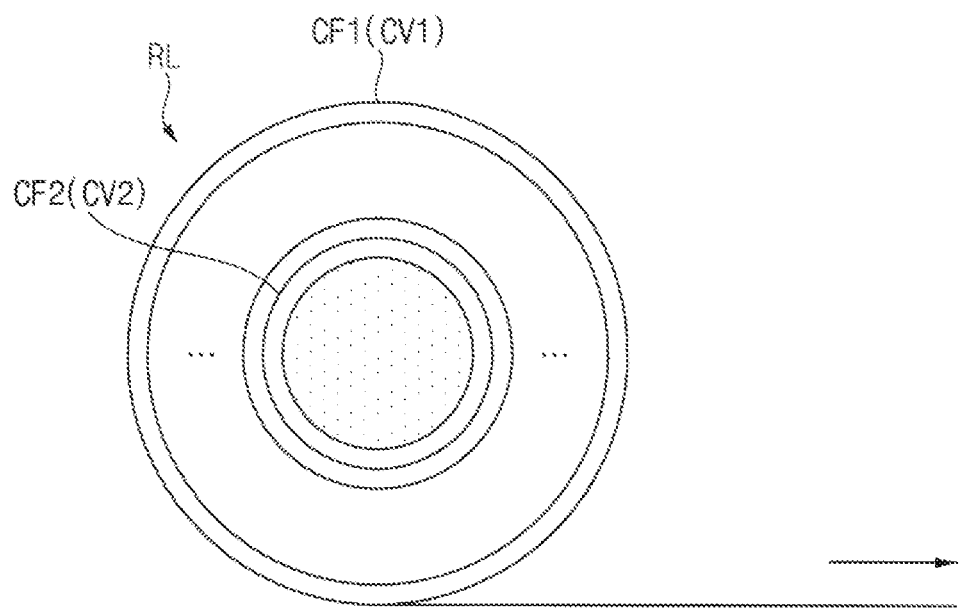
FIG. 6 is a diagram illustrating a reel which provides a connection film.

FIG. 6 is a diagram illustrating a reel which provides a connection film.

Referring to FIG. 6, a reel RL may provide the connection film CF included in the display device 1000 of FIG. 1. The connection film CF may be wound on the reel RL in the form of a roll.

The connection film CF may have different degrees of curvature depending on the length at which the connection film CF is stored from the center of the reel RL. For example, a first degree of curvature CV1 of the first connection film CF1 positioned at an outer diameter of the reel RL may be different from a second degree of curvature CV2 of the second connection film CF2 positioned at an inner diameter of the reel RL.

In the method of manufacturing a display device according to embodiments of the present invention, the connection film CF and the printed circuit board PCB may be realigned in the first direction D1, according to the degree of curvature of the connection film CF. Accordingly, the connection film CF may be precisely aligned with the printed circuit board PCB in the first direction D1.

Figure 7:
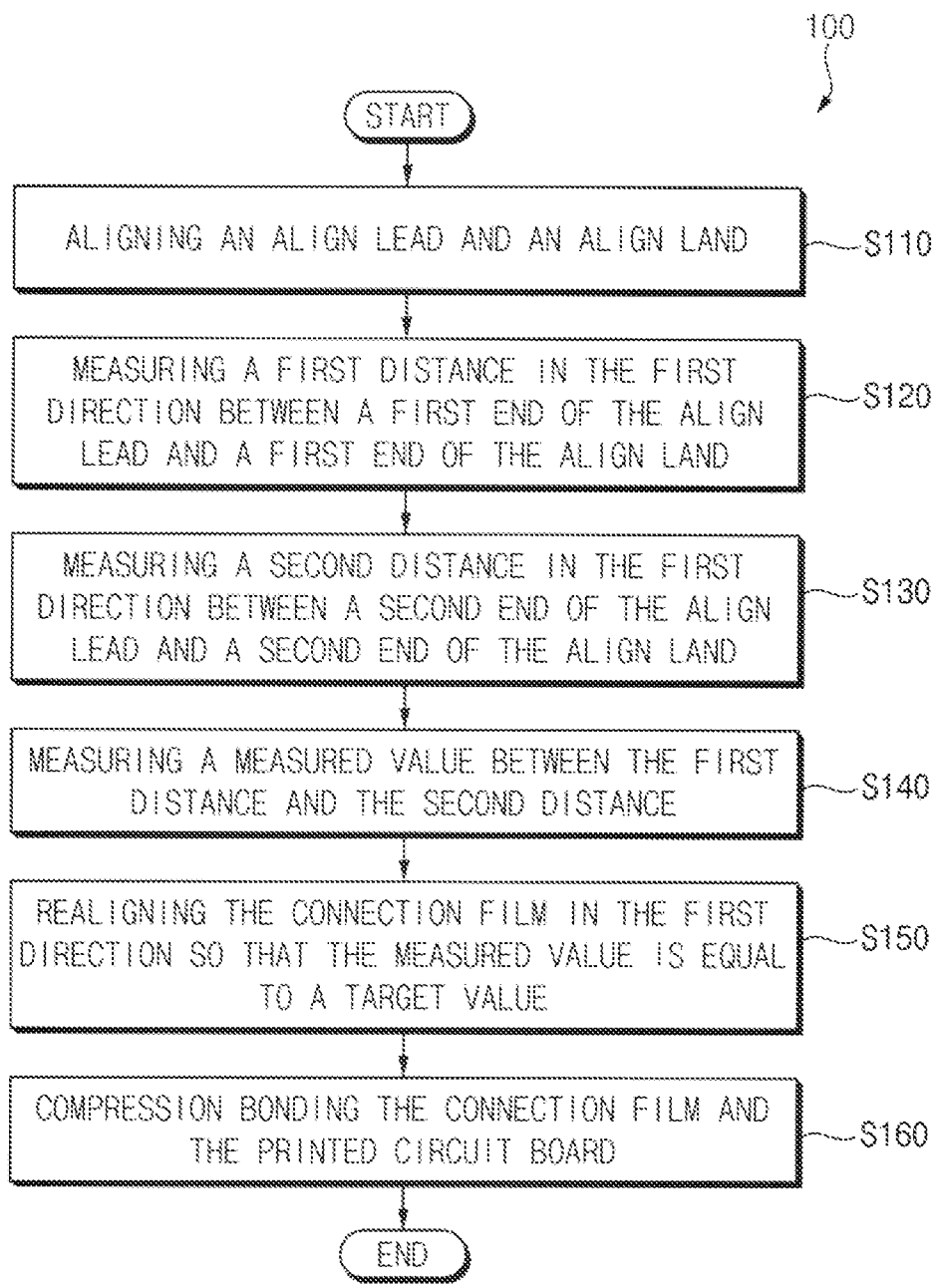
FIG. 7 is a flowchart illustrating a method of manufacturing a display device according to an embodiment of the present invention.

FIG. 7 is a flowchart illustrating a method of manufacturing a display device according to an embodiment of the present invention. FIGS. 8 to 13 are diagrams illustrating a method of manufacturing a display device including a connection film having a first degree of curvature, according to the method of FIG. 7.

Figure 8:
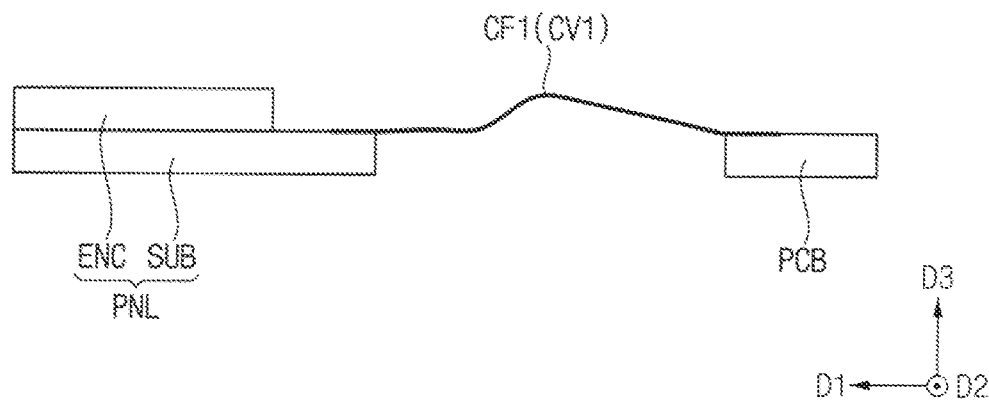
FIGS. 8 to 13 are diagrams illustrating a method of manufacturing a display device including a connection film having a first degree of curvature, according to the method of FIG. 7.

Referring to FIGS. 7 and 8, in the method of manufacturing a display device S100 according to an embodiment of the present invention, the display panel PNL on which the first connection film CF1 is disposed and the printed circuit board PCB may be aligned. Accordingly, the first align lead AE1 and the first align land AA1 may be aligned S110.

Figure 9:
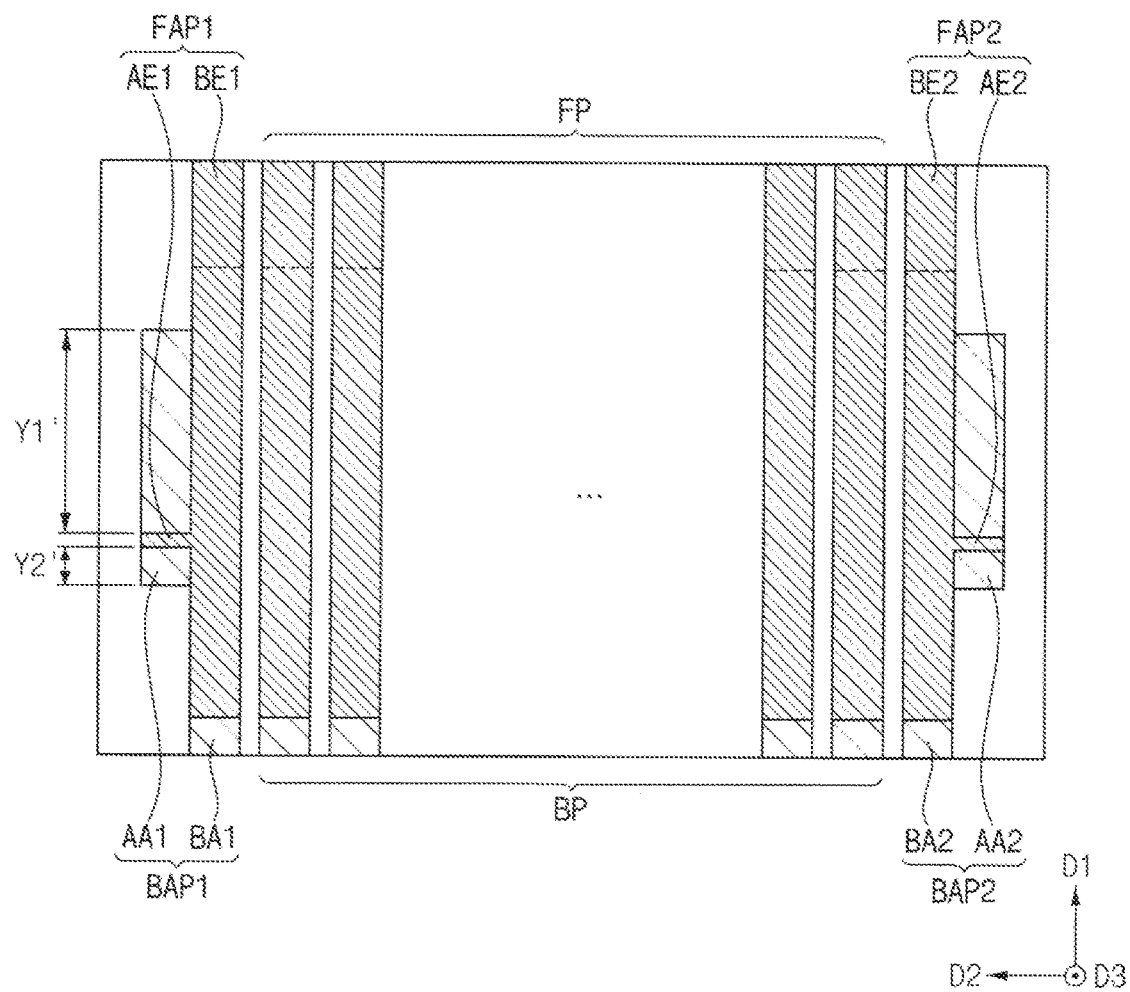

Referring to FIGS. 7 and 9, a first distance Y1' in the first direction D1 between a first end of the first align lead AE1 and a first end of the first align land AA1 may be measured S120. For example, the first end of the first align lead AE1 and the first end of the first align land AA1 may be adjacent to each other.

In addition, a second distance Y2' in the first direction D1 between a second end of the first align lead AE1 and a second end of the first align land AA1 may be measured S130. For example, the second end of the first align lead AE1 and the second end of the first align land AA1 may be adjacent to each other.

A measured value between the first distance Y1' and the second distance Y2' may be measured S140. In an embodiment, the measured value may be a difference between the first distance Y1' and the second distance Y2'. For example, as shown in FIG. 9, the measured value may be the difference (Y1'−Y2') between the first distance (Y1') and the second distance (Y2'), and may be about 2 μm. In this case, the film pads FP and the board pads BP may at least partially overlap each other while being misaligned in the first direction D1.

Referring to FIGS. 7, 10, 11, and 12, the first connection film CF1 may be realigning in the first direction D1 so that the measured value is the same as a target value S150. In this case, the printed circuit board PCB may be fixed in the first direction D1, and the first connection film CF1 may move in the first direction D1.

In an embodiment, the target value may be a predetermined value according to the first degree of curvature CV1 of the first connection film CF1. For example, the target value may be set according to the degree of curvature of the connection film.

Figure 10:
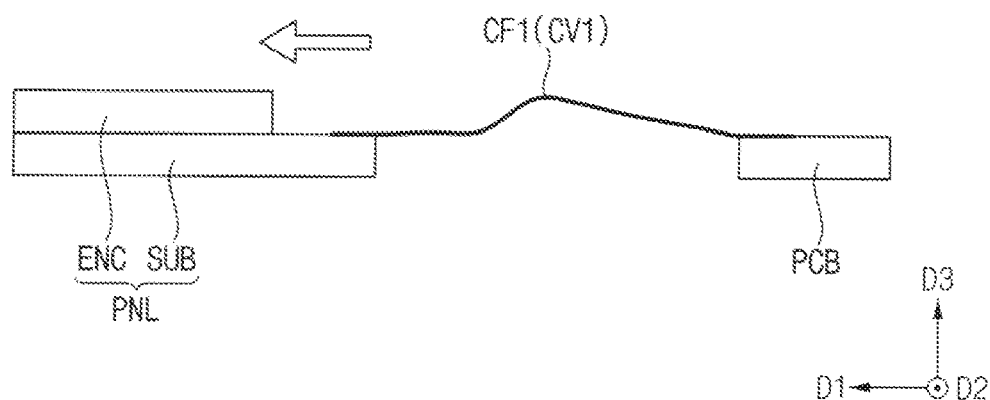
Figure 11:
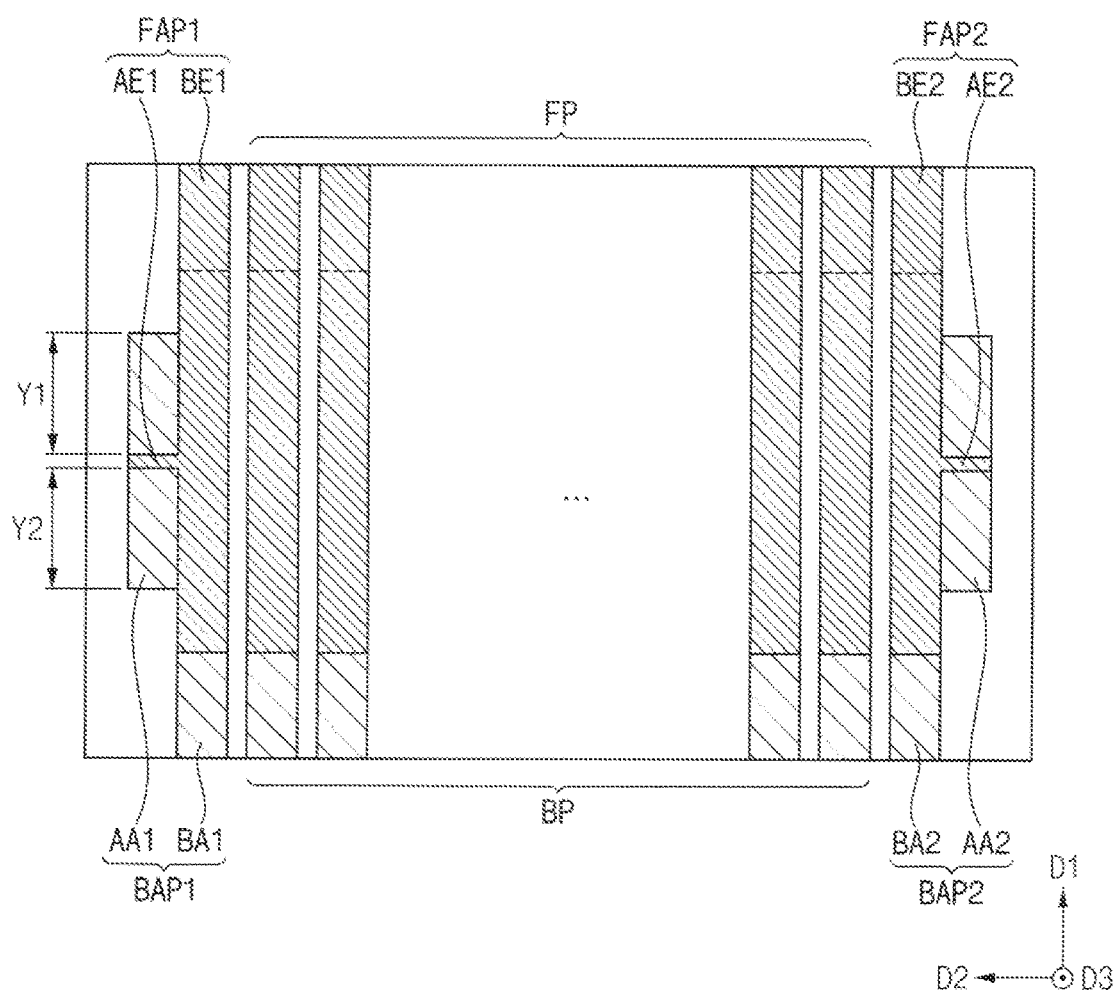
Figure 12:
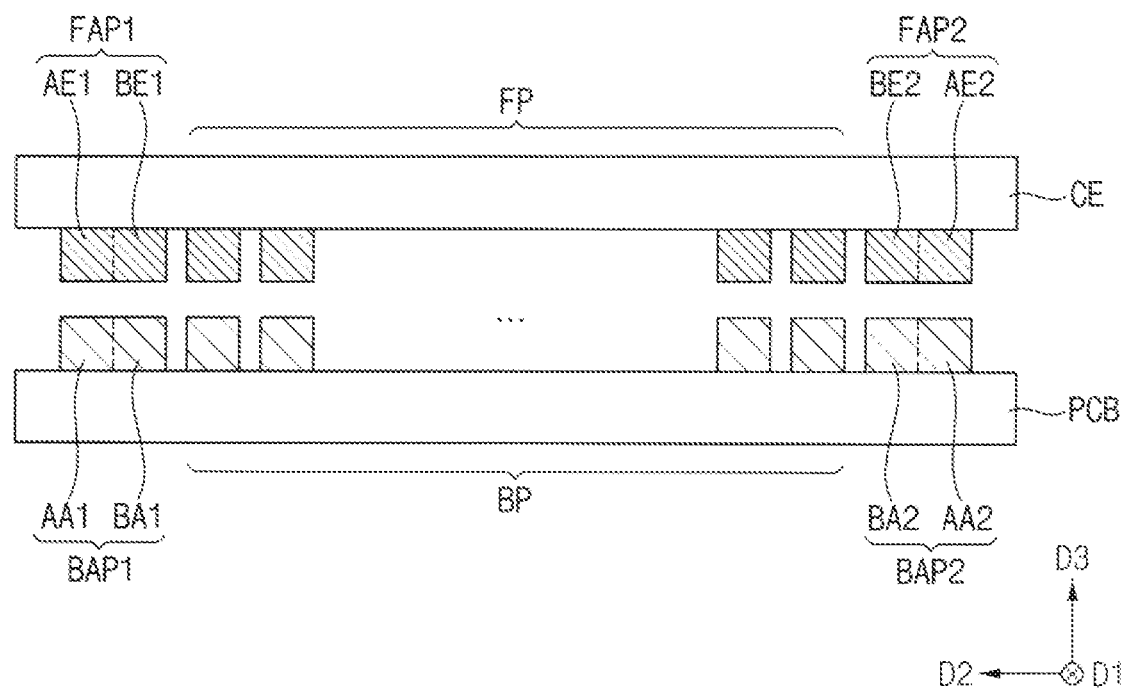

For example, as shown in FIGS. 10 and 11, when the first connection film CF1 has the first degree of curvature CV1, the target value may be about 0 μm. The first connection film CF1 may be moved in the first direction D1 so that the measured value (e.g., 2 μm) is equal to the target value (e.g., 0 μm). Accordingly, the first connection film CF1 may be precisely aligned with the printed circuit board PCB in the first direction D1.

Figure 13:
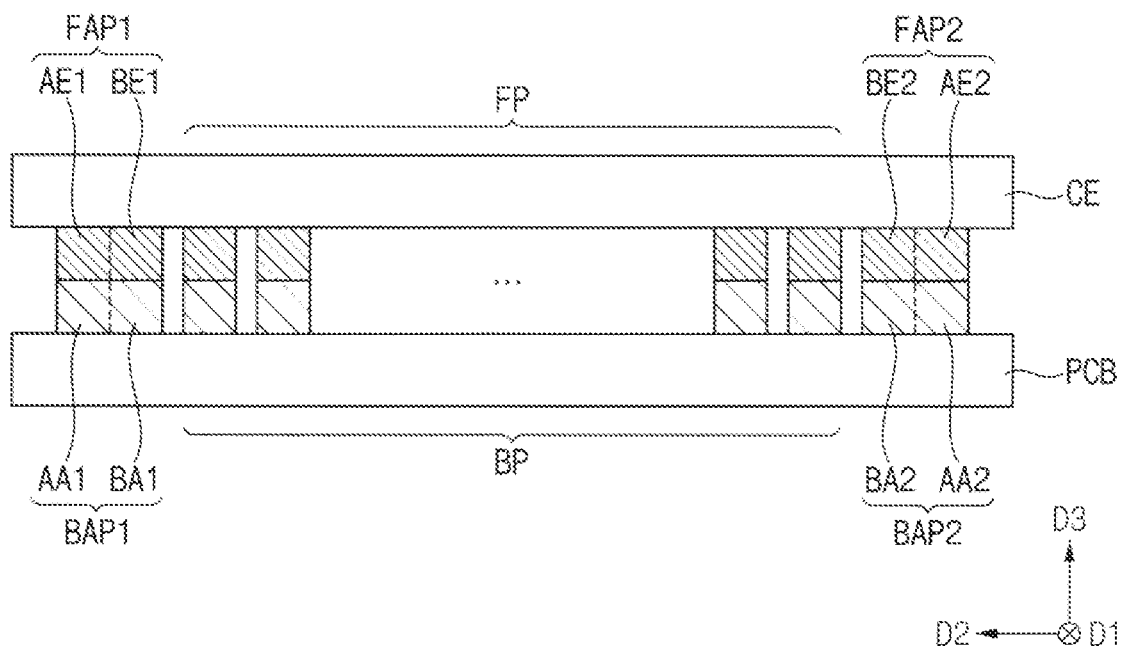

Referring to FIGS. 7 and 13, the first connection film CF1 and the printed circuit board PCB may be compression bonded S160 to each other. Accordingly, the film pads FP may contact the board pads BP, respectively. In addition, the first film align pad FAP1 may contact the first board align pad BAP1, and the second film align pad FAP2 may contact the second board align pad BAP2.

FIGS. 14 to 19 are diagrams illustrating a method of manufacturing a display device including a connection film having a second degree of curvature, according to the method of FIG. 7.

Figure 14:
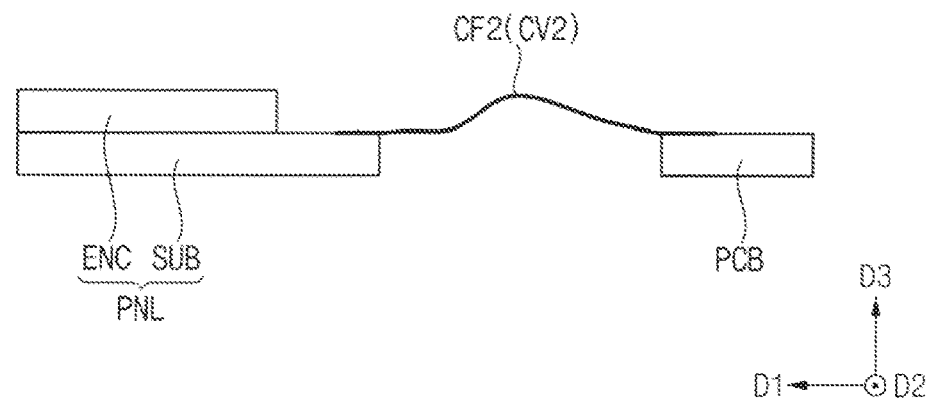
FIGS. 14 to 19 are diagrams illustrating a method of manufacturing a display device including a connection film having a second degree of curvature, according to the method of FIG. 7.

Referring to FIGS. 7 and 14, in the method of manufacturing the display device S100 according to an embodiment of the present invention, the display panel PNL on which the second connection film CF2 is disposed and the printed circuit board PCB may be aligned. Accordingly, the first align lead AE1 and the first align land AA1 may be aligned S110.

Figure 15:
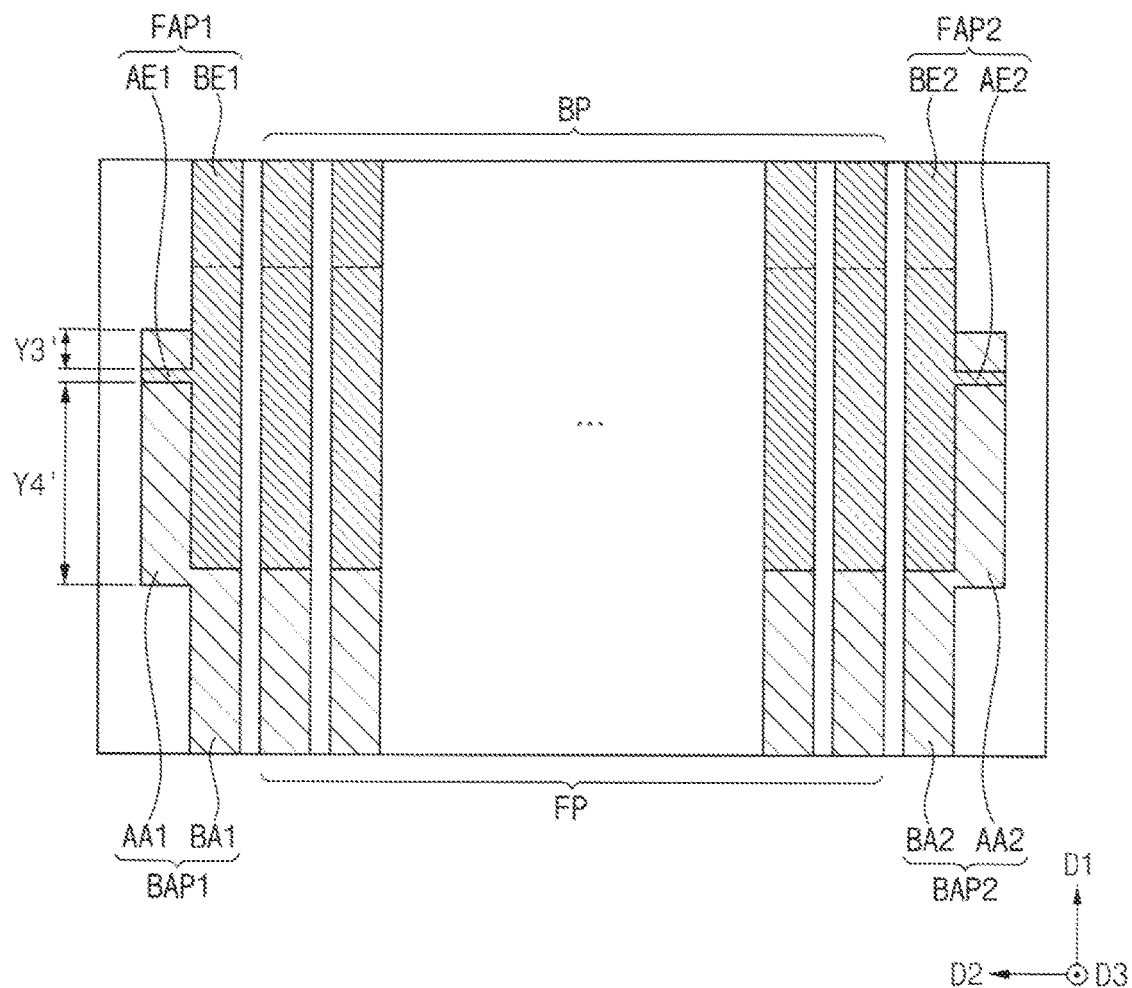

Referring to FIGS. 7 and 15, a first distance Y3' in the first direction D1 between a first end of the first align lead AE1 and a first end of the first align land AA1 may be measured S120. For example, the first end of the first align lead AE1 and the first end of the first align land AA1 may be adjacent to each other.

In addition, a second distance Y4' in the first direction D1 between a second end of the first align lead AE1 and a second end of the first align land AA1 may be measured S130. For example, the second end of the first align lead AE1 and the second end of the first align land AA1 may be adjacent to each other.

A measured value between the first distance Y3' and the second distance Y4' may be measured S140. In an embodiment, the measured value may be a difference between the first distance Y3' and the second distance Y4'. For example, as shown in FIG. 15, the measured value may be the difference (Y3'–Y4') between the first distance (Y3') and the second distance (Y4'), and may be about −2 μm. In this case, the film pads FP and the board pads BP may at least partially overlap each other while being misaligned in the first direction D1.

Referring to FIGS. 7, 16, 17, and 18, the second connection film CF2 may be realigned in the first direction D1 so that the measured value is the same as the target value S150. In this case, the printed circuit board PCB may be fixed in the first direction D1, and the second connection film CF2 may move in a direction opposite to the first direction D1.

In an embodiment, the target value may be a predetermined value according to the second degree of curvature CV2 of the second connection film CF2. For example, the target value may be set according to the degree of curvature of the connection film.

Figure 16:
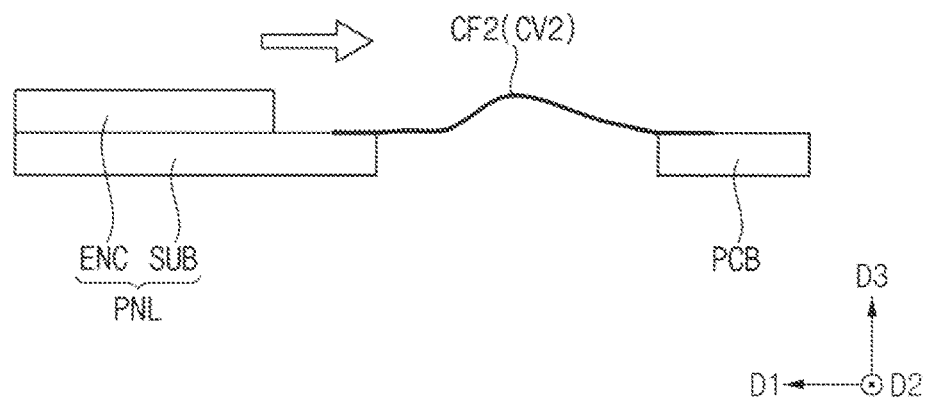
Figure 17:
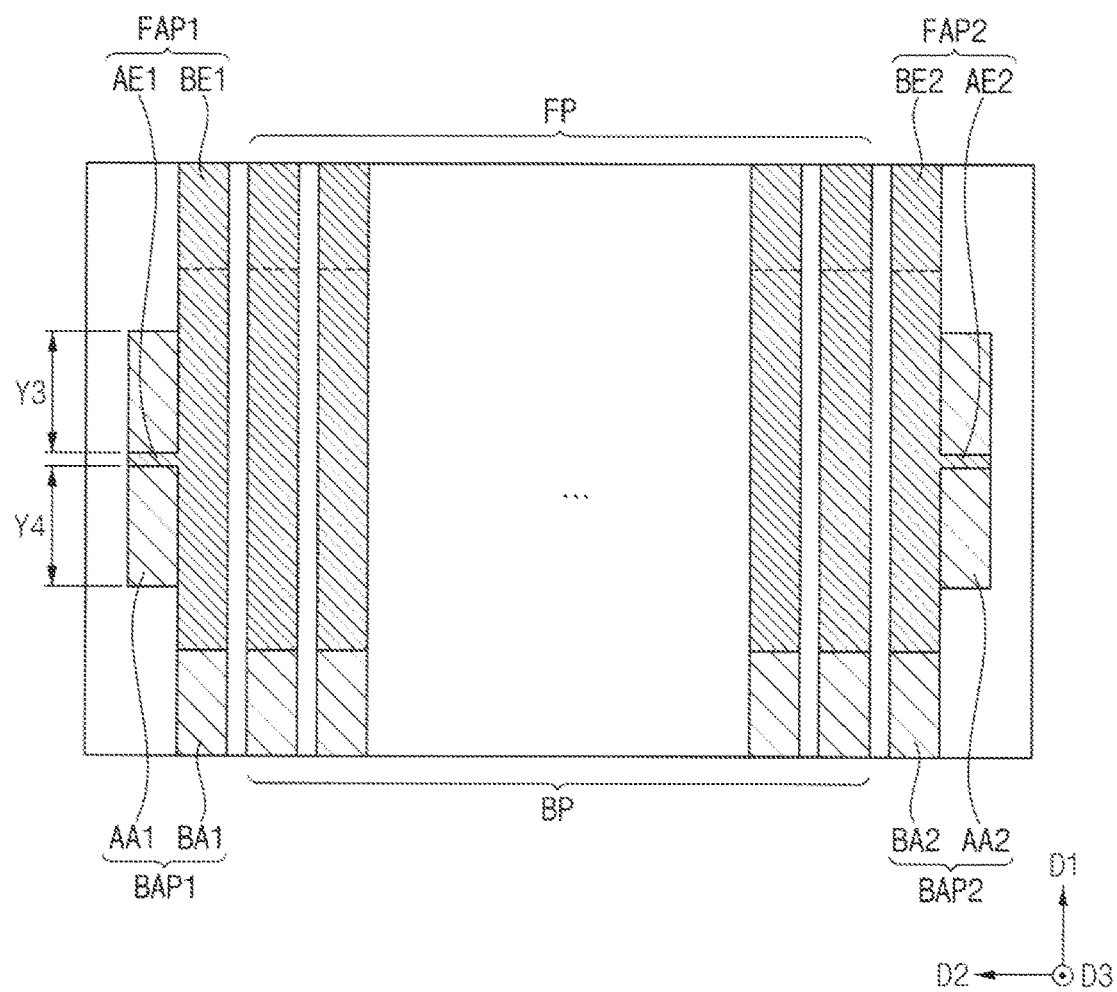
Figure 18:
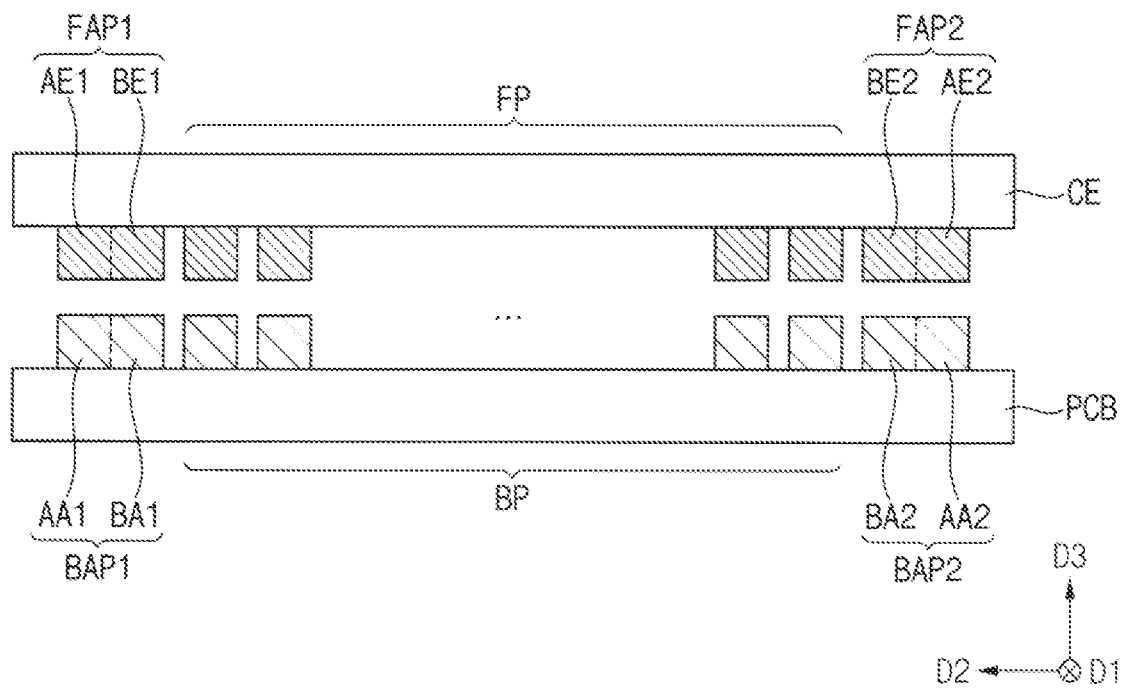

For example, as shown in FIGS. 16 and 17, when the second connection film CF2 has the second degree of curvature CV2, the target value may be about −1 μm. The second connection film CF2 may be moved in a direction opposite to the first direction D1 so that the measured value (e.g., −2 μm) is equal to the target value (e.g., −1 μm). Accordingly, the second connection film CF2 may be precisely aligned with the printed circuit board PCB in the first direction D1.

Figure 19:
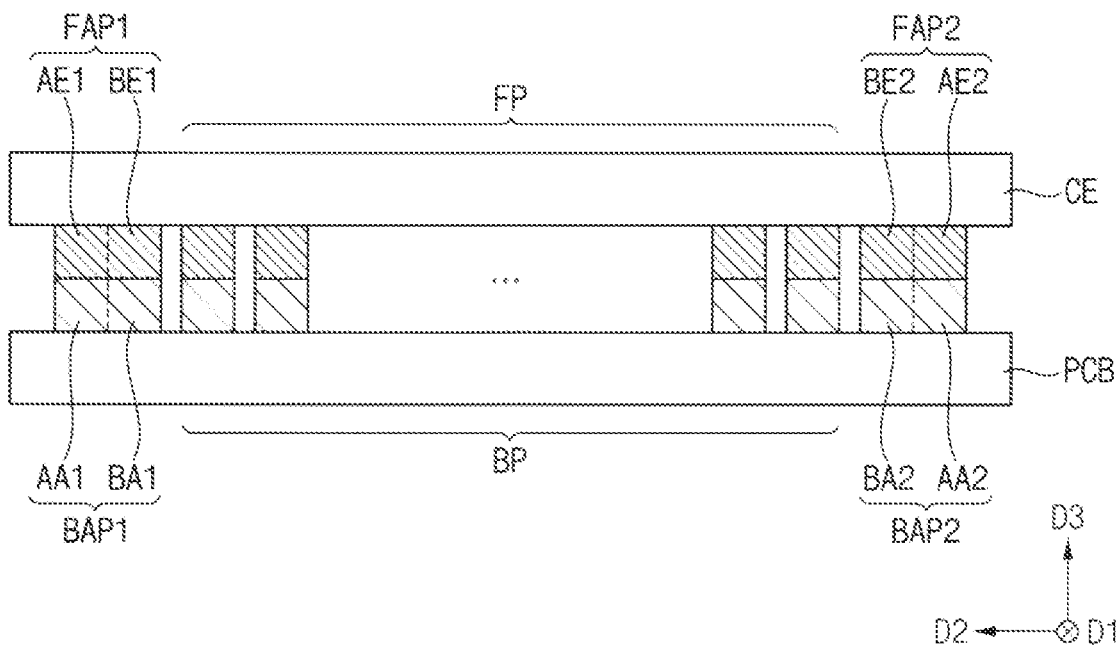

Referring to FIGS. 7 and 19, the second connection film CF2 and the printed circuit board PCB may be compression bonded S160 to each other. Accordingly, the film pads FP may contact the board pads BP, respectively. In addition, the first film align pad FAP1 may contact the first board align pad BAP1, and the second film align pad FAP2 may contact the second board align pad BAP2.

In the manufacturing method S100 according to an embodiment of the present invention, a first distance between the first end of the align lead and the first end of the align land may be measured, and a second distance between the second end of the align lead and the second end of the align land may be measured, and a measured value between the first distance and the second distance may be measured. The connection film may be realigned in the first direction so that the measured value is the same as a target value set according to the degree of curvature of the connection film. Accordingly, even if the connection films have different degrees of curvature, the film pads and the board pads may contact each other with a constant contact area in the first direction.

Figure 20:
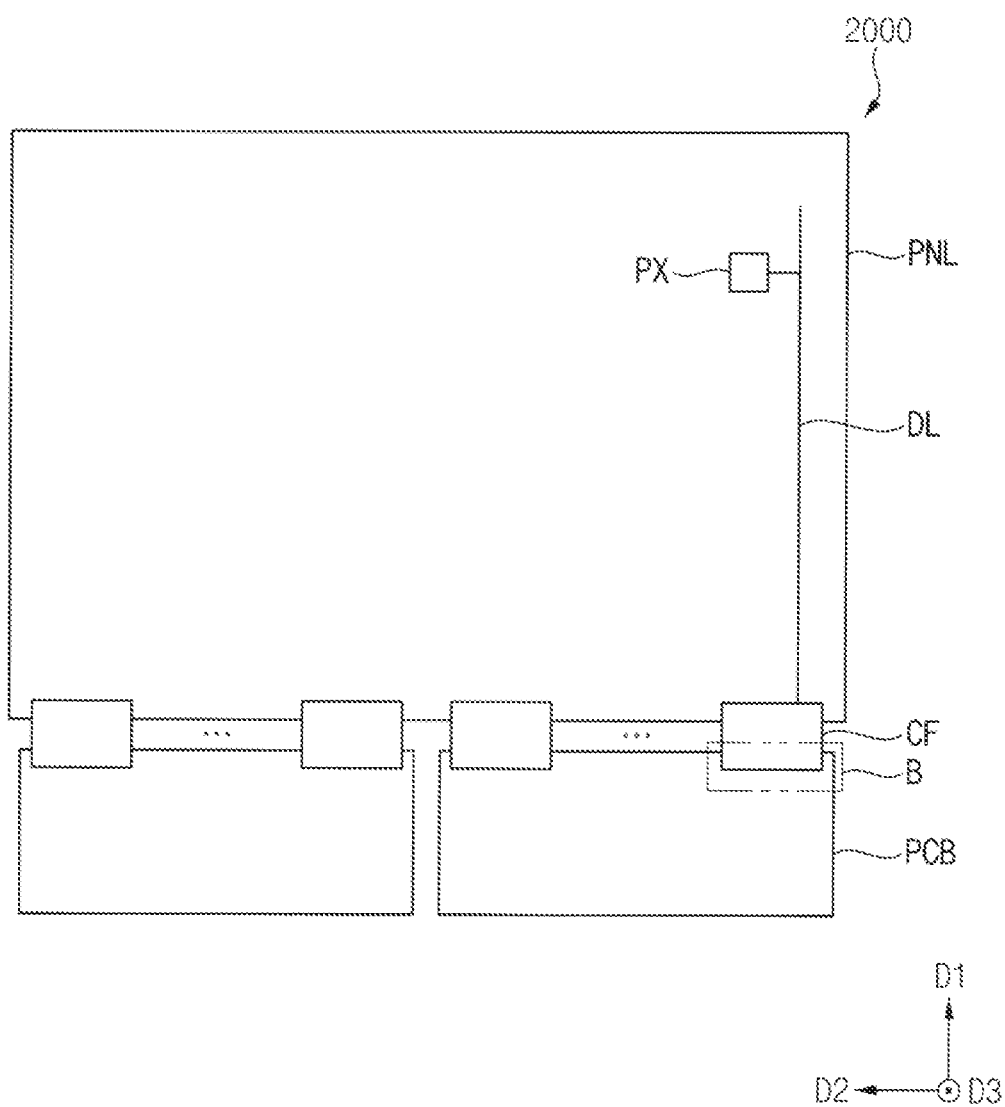
FIG. 20 is a plan view illustrating a display device according to an embodiment of the present invention.
Figure 21:
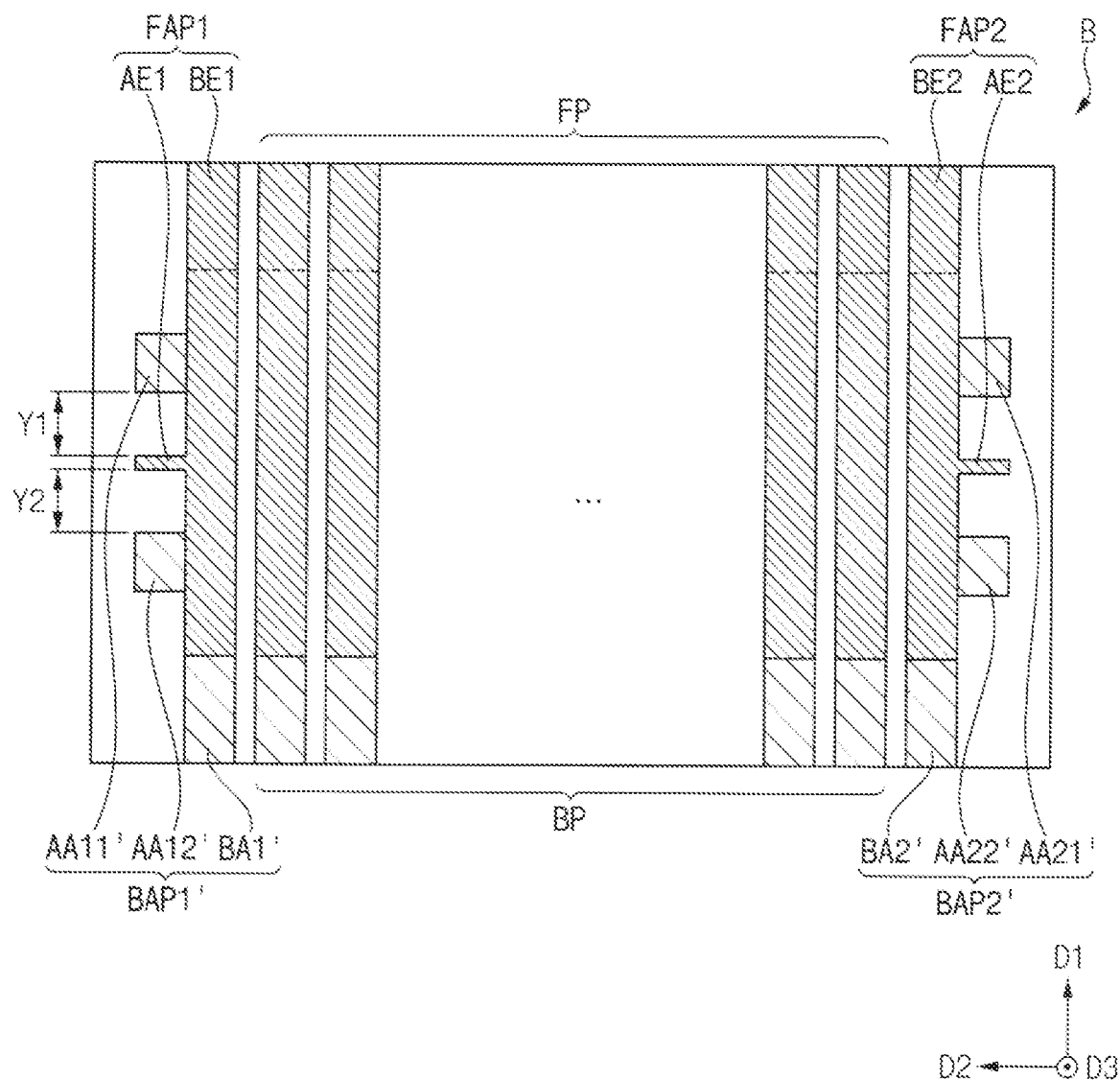
FIG. 21 is an enlarged plan view of area B of FIG. 20.
Figure 22:
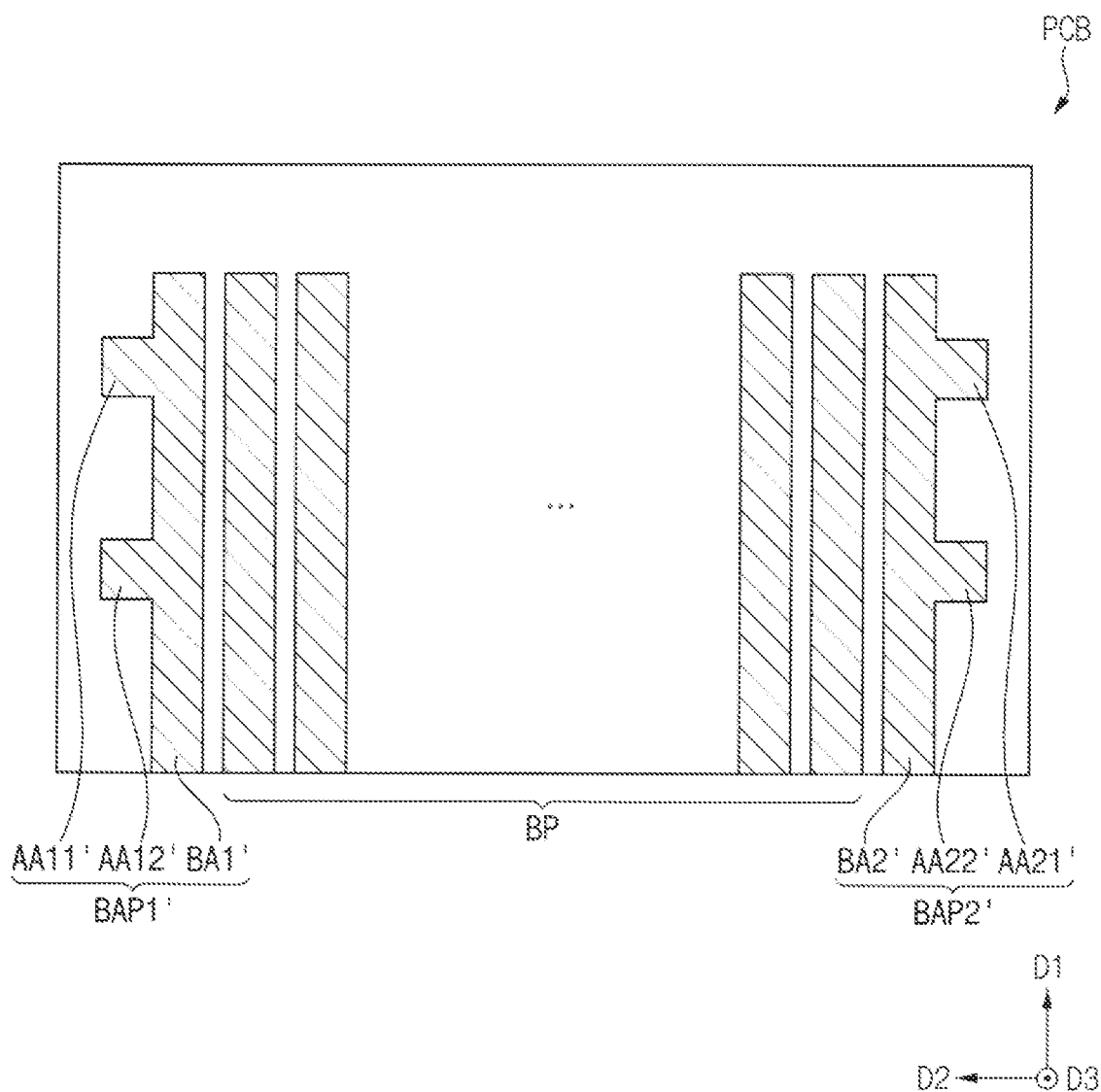
FIG. 22 is a plan view illustrating a printed circuit board shown in the FIG. 21.
Figure 23:
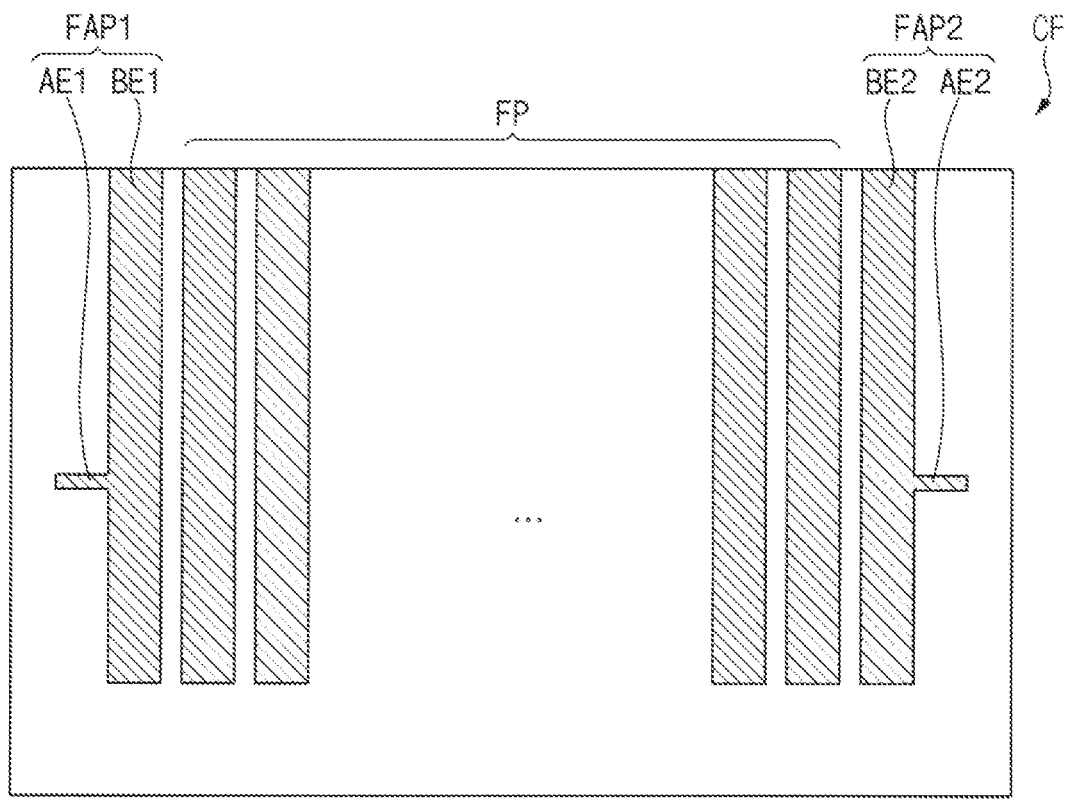
FIG. 23 is a plan view illustrating a connection film shown in the FIG. 21.

FIG. 20 is a plan view illustrating a display device according to an embodiment of the present invention. FIG. 21 is an enlarged plan view of area B of FIG. 20. FIG. 22 is a plan view illustrating a printed circuit board shown in the FIG. 21. FIG. 23 is a plan view illustrating a connection film shown in the FIG. 21. It is to be understood that any of the elements shown in FIG. 20 may be substituted and recombined with any of the elements shown in FIG. 1.

Referring to FIG. 20, a display device 2000, according to an embodiment, may include a display panel PNL, at least one connection film CF, and at least one printed circuit board PCB.

Referring to FIG. 21, a first film align pad FAP1, film pads FP, and a second film align pad FAP2 may be disposed under the connection film CF. A first board align pad BAP1', board pads BP, and a second board align pad BAP2' may be disposed on the printed circuit board PCB.

However, the display device 2000 may be substantially the same as the display device 1000 described with reference to FIG. 1, except for the first board align pad BAP1' and the second board align pad BAP2'.

Referring to FIG. 22, the first board align pad BAP1 ', the board pads BP, and the second board align pad BAP2' may be arranged side by side in the second direction D2. The board pads BP may be disposed between the first board align pad BAP1' and the second board align pad BAP2'.

The first board align pad BAP1' may include a first base land BA1', a first align land AA11', and a second align land AA12'. The first base land BA1' may extend in the first direction D1. The first align land AA11' and the second align land AA12' may protrude from the first base land BA1' in the second direction D2. The first align land AA11' and the second align land AA12' may be spaced apart from each other in the first direction D1.

The board pads BP may be arranged side by side in the second direction D2. Each of the board pads BP may extend in the first direction D1. For example, the shape of each of the board pads BP may be substantially the same as the shape of the first base land BA1'.

The second board align pad BAP2' may include a second base land BA2', a third align land AA21', and a fourth align land AA22'. The second base land BA2' may extend in the first direction D1. The third align land AA21' and the fourth align land AA22' may protrude from the second base land BA2' in a direction opposite to the second direction D2. The third align land AA21' and the fourth align land AA22' may be spaced apart from each other in the first direction D1.

Referring to FIG. 23, the second film align pad FAP2, the film pads FP, and the first film align pad FAP1 may be arranged side by side in the second direction D2. The film pads FP may be disposed between the first film align pad FAP1 and the second film align pad FAP2.

The first film align pad FAP1 may include a first base lead BE1 and a first align lead AE1. The first base lead BE1 may extend in the first direction D1. The first align lead AE1 may protrude from the first base lead BE1 in the second direction D2.

The film pads FP may be arranged side by side in the second direction D2. Each of the film pads FP may extend in the first direction D1. For example, the shape of each of the film pads FP may be substantially the same as the shape of the first base lead BE1

The second film align pad FAP2 may include a second base lead BE2 and a second align lead AE2. The second base lead BE2 may extend in the first direction D1. The second align lead AE2 may protrude from the second base lead BE2 in a direction opposite to the second direction D2.

Referring back to FIG. 21, in an embodiment, the first align lead AE1 and the first align land AA11' might not overlap each other. In addition, the first align lead AE1 and the second align land AA12' might not overlap each other.

A length of the first align lead AE1 in the second direction D2 may be substantially the same as a length of the first align land AA11' in the second direction D2 and may be substantially the same as a length of the second align land AA12' in the second direction D2.

A measured value between a first distance Y1 between a first end of the first align lead AE1 and a first end of the first align land AA11' and a second distance Y2 between a second end of the first align lead AE1 and a second end of the second align land AA12' may be measured, and the measured value may be applied to the method S100 described with reference to FIG. 7, so that the film pads FP and the board pads BP may be precisely aligned.

Figure 24:
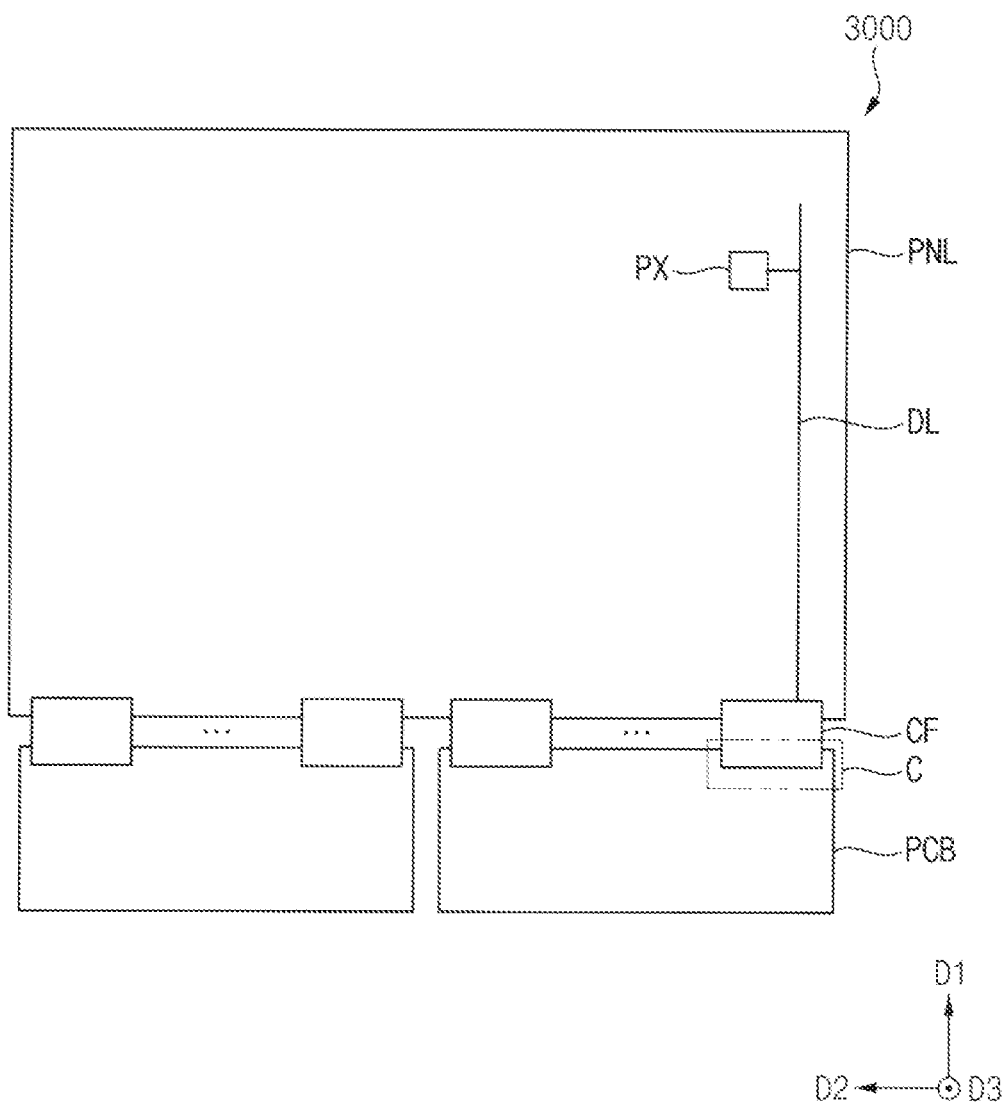
FIG. 24 is a plan view illustrating a display device according to an embodiment of the present invention.
Figure 25:
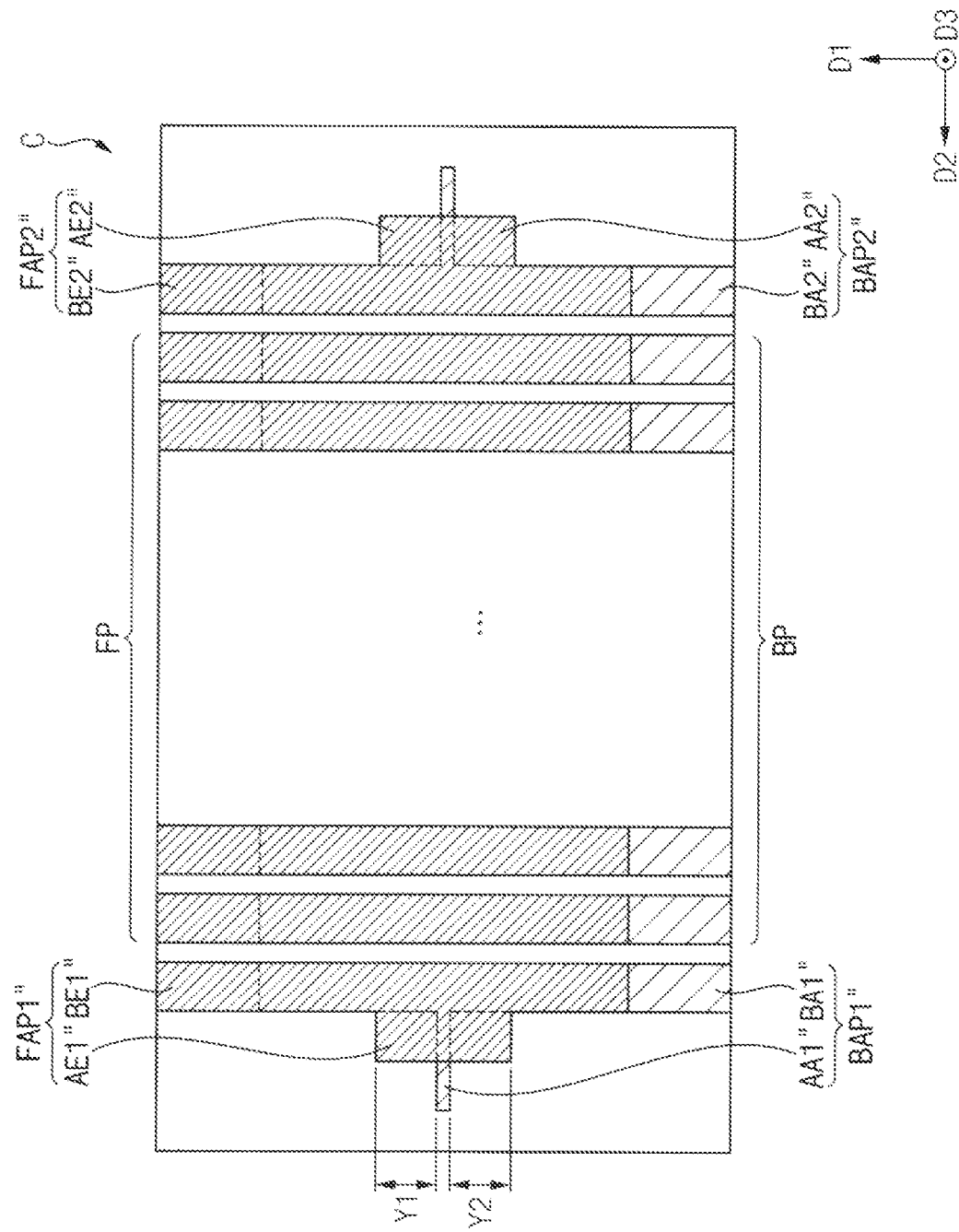
FIG. 25 is an enlarged plan view of area C of FIG. 24.
Figure 26:
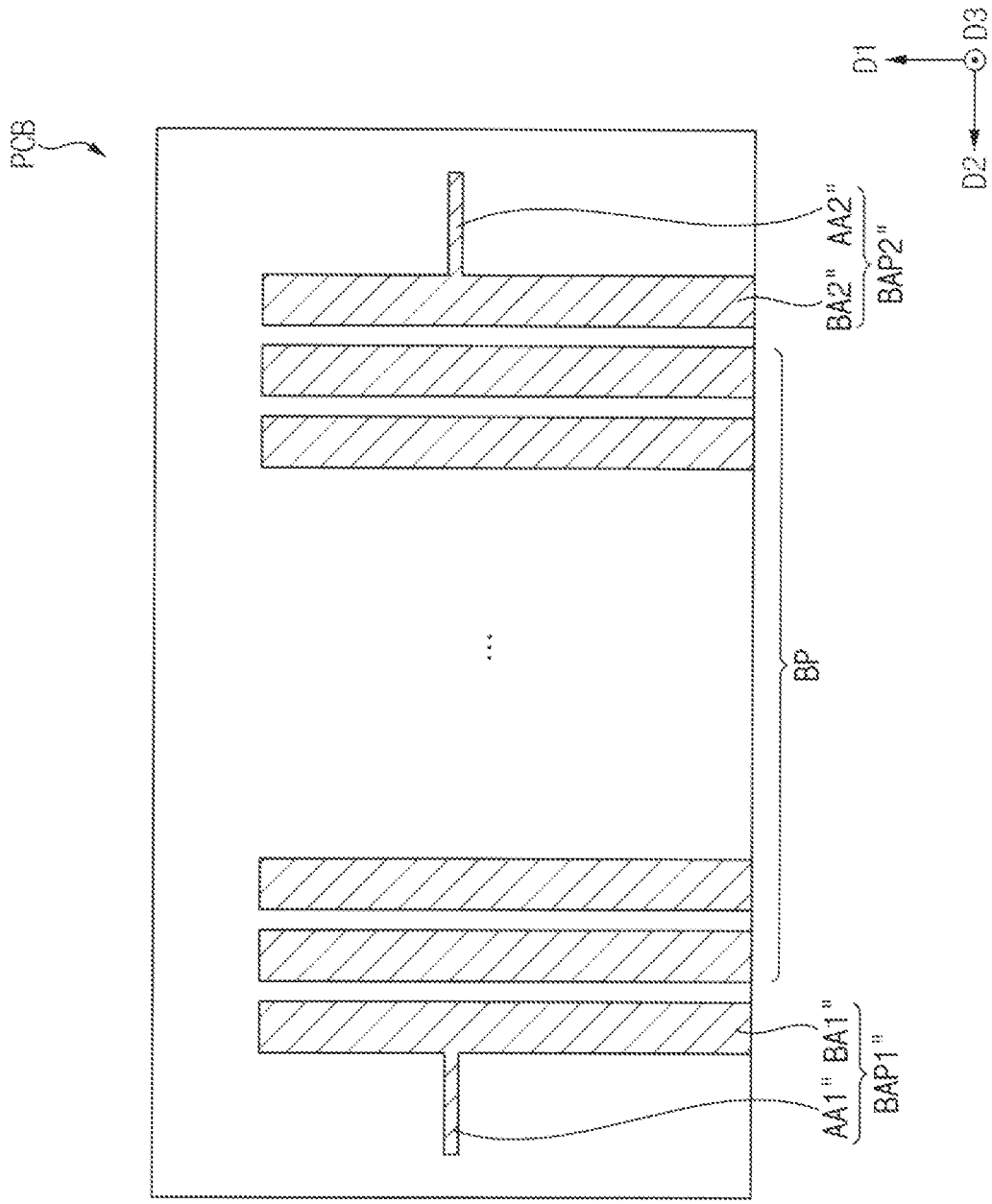
FIG. 26 is a plan view illustrating a printed circuit board shown in the FIG. 25.
Figure 27:
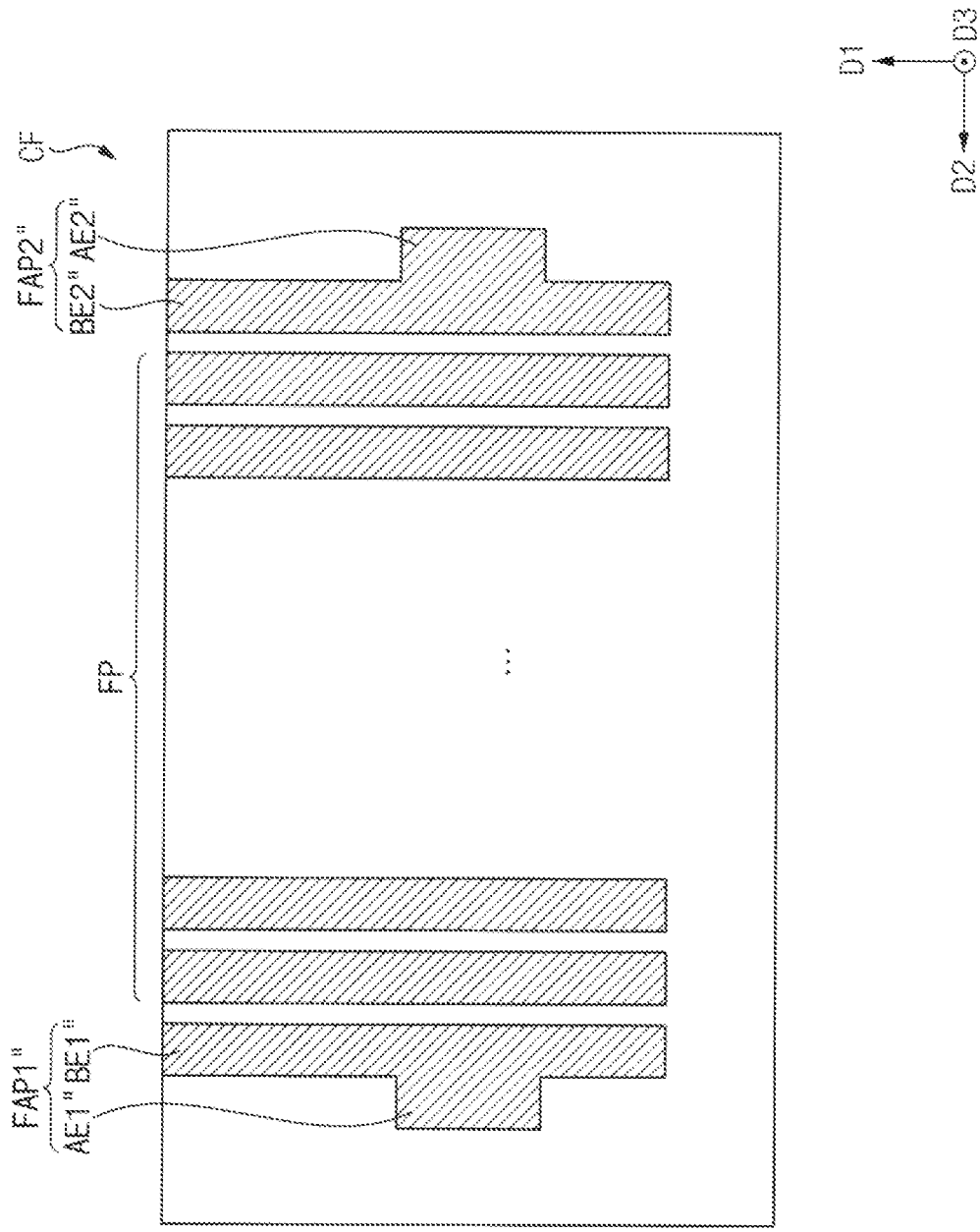
FIG. 27 is a plan view illustrating a connection film shown in the FIG. 25.

FIG. 24 is a plan view illustrating a display device according to an embodiment of the present invention. FIG. 25 is an enlarged plan view of area C of FIG. 24. FIG. 26 is a plan view illustrating a printed circuit board shown in the FIG. 25. FIG. 27 is a plan view illustrating a connection film shown in the FIG. 25. It is to be understood that any of the elements shown in FIG. 20 may be substituted and recombined with any of the elements shown in FIG. 1 and/or FIG. 20.

Referring to FIG. 24, a display device 3000, according to an embodiment, may include a display panel PNL, at least one connection film CF, and at least one printed circuit board PCB.

Referring to FIG. 25, a first film align pad FAP1", a film pad FP, and a second film align pad FAP2" may be disposed under the connection film CF. A first board align pad BAP1", board pads BP, and a second board align pad BAP2" may be disposed on the printed circuit board PCB.

Referring to FIG. 26, the first board align pad BAP1", the board pads BP, and the second board align pad BAP2" may be arranged in the second direction D2. The board pads BP may be disposed between the first board align pad BAP1" and the second board align pad BAP2".

The first board align pad BAP1" may include a first base land BA1" and a first align land AA1". The first base land BA1" may extend in the first direction D1. The first align land AA1" may protrude from the first base land BA1" in the second direction D2.

The board pads BP may be arranged side by side in the second direction D2. Each of the board pads BP may extend in the first direction D1. For example, the shape of each of the board pads BP may be substantially the same as the shape of the first base land BA1".

The second board align pad BAP2" may include a second base land BA2" and a second align land AA2". The second base land BA2" may extend in the first direction D1. The second align land AA2" may protrude from the second base land BA2" in a direction opposite to the second direction D2.

Referring to FIG. 27, the second film align pad FAP2", the film pads FP, and the first film align pad FAP1" may be arranged in the second direction D2. The film pads FP may be disposed between the first film align pad FAP1" and the second film align pad FAP2".

The first film align pad FAP1" may include a first base lead BE1" and a first align lead AE1". The first base lead BE1" may extend in the first direction D1. The first align lead AE1" may protrude from the first base lead BE1" in the second direction D2.

The film pads FP may be arranged side by side in the second direction D2. Each of the film pads FP may extend in the first direction D1. For example, the shape of each of the film pads FP may be substantially the same as the shape of the first base lead BE1".

The second film align pad FAP2" may include a second base lead BE2" and a second align lead AE2". The second base lead BE2" may extend in the first direction D1. The second align lead AE2" may protrude from the second base lead BE2" in a direction opposite to the second direction D2.

Referring back to FIG. 25, in an embodiment, the first align lead AE1" may partially overlap the first align land AA1". In addition, the first align land AA1" may partially overlap the first align lead AE1".

A length of the first align lead AE1" in the first direction D1 may be greater than a length of the first align land AA1" in the first direction D1. In addition, a length of the first align lead AE1" in the second direction D2 may be smaller than a length of the first align land AA1" in the second direction D2.

A measured value between a first distance Y1 between a first end of the first align lead AE1" and a first end of the first align land AA1" and a second distance Y2 between a second end of the first align lead AE1" and a second end of the first align land AA1", and the measured value applied to the method S100 described with reference to FIG. 7, so that the film pads FP and the board pads BP may be precisely aligned.

Although certain embodiments and implementations have been described herein, other embodiments and modifications will be apparent from this description. Accordingly, the inventive concepts are not necessarily limited to the embodiments described herein, but rather various modifications and equivalent arrangements as would be apparent to a person of ordinary skill in the art are within the scope of the present disclosure.

What is claimed is:

1. A display device, comprising: a film align pad disposed under a connection film that is connected to a display panel, the film align pad including a base lead and an align lead, wherein the base lead extends in a first direction and the align lead protrudes from the base lead in a second direction intersecting the first direction; and a board align pad disposed on a printed circuit board that is connected to the connection film, the board align pad including a base land and an align land, wherein the base land extends in the first direction and the align land protrudes from the base land in the second direction, wherein the align land is divided into a first exposed portion, an overlapping portion, and a second exposed portion, wherein the first exposed portion is exposed by the align lead, wherein the second exposed portion is exposed by the align lead and spaced apart from the first exposed portion, and wherein the overlapping portion overlaps the align lead and is positioned between the first and second exposed portions; and a first distance between a first end of the align lead and a first end of the align land in the first direction; a second distance between a second end of the align lead and a second end of the align land in the first direction; wherein realigning the connection film and the printed circuit board in the first direction so that a measured value between the first distance and the second distance is equal to a target value which is set according to a degree of curvature of the connection film.

2. The display device of claim 1, wherein the align lead completely overlaps the align land, and
wherein the align land partially overlaps the align lead.

3. The display device of claim 2, wherein a length of the align lead in the first direction is smaller than a length of the align land in the first direction.

4. The display device of claim 2, wherein a length of the align lead in the second direction is equal to a length of the align land in the second direction.

5. The display device of claim 1, further comprising:
film pads disposed under the connection film and arranged in the second direction,
wherein the film align pad is arranged in the second direction together with the film pads.

6. The display device of claim 1, further comprising:
board pads disposed on the printed circuit board and arranged in the second direction,
wherein the board align pad is arranged in the second direction together with the board pads.

7. An electronic device comprising: a film align pad disposed under a connection film that is connected to a display panel, the film align pad including a base lead and an align lead, wherein the base lead extends in a first direction and the align lead protrudes from the base lead in a second direction intersecting the first direction; and a board align pad disposed on a printed circuit board that is connected to the connection film, the board align pad including a base land and an align land, wherein the base land extends in the first direction and the align land protrudes from the base land in the second direction, wherein the align land is divided into a first exposed portion, an overlapping portion, and a second exposed portion, wherein the first exposed portion is exposed by the align lead, wherein the second exposed portion is exposed by the align lead and spaced apart from the first exposed portion, and wherein the overlapping portion overlaps the align lead and is positioned between the first and second exposed portions; and a first distance between a first end of the align lead and a first end of the align land in the first direction; a second distance between a second end of the align lead and a second end of the align land in the first direction; wherein realigning the connection film and the printed circuit board in the first direction so that a measured value between the first distance and the second distance is equal to a target value which is set according to a degree of curvature of the connection film.

8. The electronic device of claim 7, wherein the align lead completely overlaps the align land, and
wherein the align land partially overlaps the align lead.

9. The electronic device of claim 8, wherein a length of the align lead in the first direction is smaller than a length of the align land in the first direction.

10. The electronic device of claim 8, wherein a length of the align lead in the second direction is equal to a length of the align land in the second direction.

11. The electronic device of claim 7, wherein a length of the align lead in the second direction is equal to a length of the align land in the second direction.

12. The electronic device of claim 7, wherein the align lead partially overlaps the align land, and
wherein the align land partially overlaps the align lead.

13. The electronic device of claim 7, further comprising:
film pads disposed under the connection film and arranged in the second direction,
wherein the film align pad is arranged in the second direction together with the film pads.

14. The electronic device of claim 7, further comprising:
board pads disposed on the printed circuit board and arranged in the second direction,
wherein the board align pad is arranged in the second direction together with the board pads.

* * * * *